US012557598B2

(12) United States Patent
Tamatsukuri

(10) Patent No.: US 12,557,598 B2
(45) Date of Patent: Feb. 17, 2026

(54) LOAD PORT

(71) Applicant: RORZE CORPORATION, Hiroshima (JP)

(72) Inventor: Daigo Tamatsukuri, Hiroshima (JP)

(73) Assignee: RORZE CORPORATION, Hiroshima (JP)

( * ) Notice: Subject to any disclaimer, the term of this patent is extended or adjusted under 35 U.S.C. 154(b) by 500 days.

(21) Appl. No.: 18/132,986

(22) Filed: Apr. 11, 2023

(65) Prior Publication Data

US 2023/0253229 A1 Aug. 10, 2023

Related U.S. Application Data

(63) Continuation of application No. PCT/JP2021/023419, filed on Jun. 21, 2021.

(30) Foreign Application Priority Data

Oct. 20, 2020 (JP) ................. 2020-175698

(51) Int. Cl.
H01L 21/67 (2006.01)
H01L 21/673 (2006.01)
H01L 21/677 (2006.01)
H01L 21/687 (2006.01)

(52) U.S. Cl.
CPC .. *H01L 21/68764* (2013.01); *H01L 21/67126* (2013.01); *H01L 21/67259* (2013.01); *H01L 21/67386* (2013.01); *H01L 21/67772* (2013.01); *H01L 21/67775* (2013.01); *H01L 21/67778* (2013.01)

(58) Field of Classification Search
CPC ......... H01L 21/67126; H01L 21/67259; H01L 21/67386; H01L 21/67772; H01L 21/67775; H01L 21/67778
See application file for complete search history.

(56) References Cited

U.S. PATENT DOCUMENTS 9,318,363 B2 4/2016 Kai et al.
10,403,514 B1* 9/2019 Hagino ............. H01L 21/67772
(Continued)

FOREIGN PATENT DOCUMENTS

JP 2001298075 A 10/2001
JP 2009200136 A 9/2009
(Continued)

OTHER PUBLICATIONS

Extended European Search Report in EP Application No. 21882379.7 dated Oct. 29, 2024, 9pp.
(Continued)

*Primary Examiner* — Thomas Randazzo
(74) *Attorney, Agent, or Firm* — HAUPTMAN HAM, LLP

(57) ABSTRACT

A load port control unit performs an opening operation of a sealable container according to a first operation procedure when a sensor has detected a normal placement of the sealable container, and retries the opening operation according to a second operation procedure for being able to more reliably perform the opening operation of the sealable container, to prevent a transfer device from stopping, when the sensor has detected a placement abnormality of the sealable container.

20 Claims, 13 Drawing Sheets

(56) References Cited

U.S. PATENT DOCUMENTS

| | | | | |
|---|---|---|---|---|
| 2009/0245978 A1* | 10/2009 | Okabe | ............... | H01L 21/67775 |
| | | | | 414/217 |
| 2009/0245981 A1 | 10/2009 | Miyajima et al. | | |
| 2011/0188977 A1* | 8/2011 | Toyoda | ............. | H01L 21/67775 |
| | | | | 414/810 |
| 2020/0058531 A1 | 2/2020 | Matsumoto et al. | | |
| 2020/0111695 A1* | 4/2020 | Morihana | ......... | H01L 21/67772 |
| 2021/0375655 A1* | 12/2021 | Endo | ................. | H01L 21/67778 |

FOREIGN PATENT DOCUMENTS

| | | | |
|---|---|---|---|
| JP | 2009200200 | A | 9/2009 |
| JP | 2009-239004 | A | 10/2009 |
| JP | 2009239006 | A | 10/2009 |

OTHER PUBLICATIONS

Office Action in KR Application No. 10-2023-7016555 dated Jan. 20, 2025, 16pp.
Office Action in TW Application No. 110123694 dated May 6, 2024, 8pp.
International Search Report in PCT Application No. PCT/JP2021/023419, mailed Aug. 31, 2021, 5pp.

\* cited by examiner

LOAD PORT

RELATED APPLICATIONS

The present application is a continuation of International Application No. PCT/JP2021/023419, filed Jun. 21, 2021, which claims priority from Japanese Patent Applications No. 2020-175698, filed Oct. 20, 2020, the disclosures of which applications are hereby incorporated by reference here in their entirety.

TECHNICAL FIELD

The present invention relates to a lid opening and closing device to attach and detach a lid of a sealable container for transferring a plurality of semiconductor wafers stored at predetermined intervals therein, and relates to a load port door that integrates with a lid of a front-opening unified pod (FOUP) which is a sealable container, to attach and detach the lid and an FOUP body from each other.

BACKGROUND ART

In the related art, the surface processing of semiconductor wafers is performed in a so-called cleanroom maintained in an environment with a high level of cleanliness; however, as the miniaturization of semiconductors progresses, maintaining the entirety of the cleanroom, in which many processing devices are installed, at a high level of cleanliness requires large facility investment costs and maintenance costs, which has become a major obstacle in terms of cost. Therefore, by maintaining the entirety of the cleanroom at a relatively low level of cleanliness and keeping only a very small environment (mini environment) inside a processing device, which performs processing on the surfaces of the wafers, at a high level of cleanliness, the yield of a semiconductor manufacturing process has been improved.

The manufacturing process of the semiconductor wafers requires many surface processing steps or inspection steps, and a large number of dedicated processing devices that perform various surface processing or inspection on the surfaces of the wafers are disposed inside the cleanroom. During processing, the wafers are accommodated in an FOUP that keeps the inside at a high level of cleanliness, and are transferred between the processing devices in the cleanroom, and various processing operations are performed on the wafers. In addition, the transfer of the FOUP to each processing device or the progress of each processing step is managed by a host computer. Each processing device that executes each processing step is provided with a wafer transfer device called an equipment front end module (EFEM), and the EFEM is provided with a plurality of lid opening and closing devices called load ports on each of which the FOUP is placed and which opens and closes a lid of the FOUP. In addition, the inside of the EFEM is maintained at a higher pressure than the environment in the cleanroom, and the EFEM is configured such that dust in the cleanroom cannot enter a very small environment (mini environment) of the EFEM. Accordingly, the wafers that have been transported from the previous step with the wafers accommodated inside the FOUP are transported to a next processing device without dust adhering thereto.

The configuration of the load port that attaches and detaches the FOUP and the lid of the FOUP from each other is regulated by semiconductor equipment and materials international (SEMI) standards established by the SEMI that is an international industry association, and many manufacturers manufacture FOUPs or load ports complying with the standards. In general, the FOUP is formed of an FOUP body that accommodates wafers, and the lid that closes an opening formed in the FOUP body, shelf boards are formed at predetermined intervals in an up-down direction inside the FOUP body, and one wafer can be accommodated on each shelf board. A seal member such as a packing is fixed to a peripheral edge of the lid that closes the opening of the FOUP body, and the seal member airtightly seals a gap between a peripheral edge of the opening of the FOUP and the lid.

Patent Document 1 describes a load port of the related art. The load port includes an advancing and retreating mechanism on which the FOUP is placed and which advances and retreats the FOUP; a load port door that integrates with the lid of the FOUP to open and close the lid; and a lifting mechanism that raises and lowers the load port door. When the FOUP is placed at a predetermined position on the advancing and retreating mechanism, the load port causes the advancing and retreating mechanism to advance the stage toward the load port door and to bring the lid of the FOUP and the load port door into contact with each other, in a state where the FOUP is fixed on a placement stage by a fixing member provided on the advancing and retreating mechanism. When the lid and the load port door have come into contact with each other, integration means provided on the load port door integrates the load port door and the lid, and releases a locking mechanism of the lid. Thereafter, the FOUP body and the lid are separated from each other by retreating the stage. After the FOUP body and the lid are separated, the lifting mechanism lowers the lid and the load port door, which are integrated, to a position where the lid and the load port door do not interfere with the transfer of wafers. With the above operation, the lid of the FOUP is opened, and a transfer robot provided in the transfer device can carry the wafers in and out of the FOUP body.

CITATION LIST

Patent Document

Patent Document 1: JP 2001-298075 A

SUMMARY OF THE INVENTION

Problem to be Solved by the Invention

In the semiconductor manufacturing process, in order to improve the number of sheets of wafers processed per unit time, the operation speed at which the load port opens and closes the lid is set to be as high as possible. In the load port of the related art, when the FOUP body and the lid are separated from each other, due to friction generated between the FOUP body and the seal member provided at the peripheral edge of the lid which are caused by relatively moving of the FOUP body and the lid at high speed, or the sticking of the seal member, the lid is not smoothly separated from the FOUP body, and the FOUP body is floated up from the advancing and retreating mechanism. In addition, if the opening operation continues with the FOUP body floated up, when the lid is completely removed from the FOUP body, a trouble occurs that the FOUP body falls on the advancing and retreating mechanism. The impact caused by the falling of the FOUP body causes the accommodated wafers to be misaligned inside the FOUP body, or the impact of the falling causes collision between the wafers and the shelf boards, which leads to the generation of dust. Further, since the FOUP body is floated up, a load sensor provided on the stage reacts and causes an error, a trouble occurs that the entirety of the transfer device including a plurality of the load ports stops.

Means for Solving Problem

In order to solve the above problems, according to the invention, there is provided a load port including: a stage to place a sealable container at a predetermined position, the sealable container including a container body to accommodate a wafer and a lid to airtightly close the container body; a sensor to detect a placement state of the sealable container on the stage; a stage drive mechanism to advance and retreat the stage; a load port door to open the sealable container by being joined and integrated with the lid and then separating the lid from the container body; a door lifting mechanism to raise and lower the load port door; and a load port control unit to store a plurality of operation procedures for operating the stage drive mechanism, the load port door, and the door lifting mechanism, and to control an operation of the stage drive mechanism, the load port door, and the door lifting mechanism based on the operation procedures. The load port control unit controls the stage drive mechanism and the door lifting mechanism to retreat the stage to the undocking position at a first speed from a state where the load port door and the lid are joined and integrated at the docking position, based on a first operation procedure, such that the lid is separated from the container body to open the sealable container, and performs control to return the sealable container to the docking position and then to re-execute an opening operation based on a second operation procedure different from the first operation procedure, in a case where the sensor has detected a placement abnormality of the sealable container when the opening operation is performed according to the first operation procedure.

With the above configuration, since the container body and the lid of the sealable container perform the opening operation according to the second operation procedure that is different from the first operation procedure which may cause the container body to be floated up, and that enables more reliably separation of the container body and the lid, even when the container body is floated up once by the opening operation according to the first operation procedure, the opening operation according to the second operation procedure enables the lid to be separated without causing the container body to be floated up from the stage. Accordingly, it is possible to prevent the occurrence of a trouble that the entirety of a transfer device including the normal load port frequently stops operating due to a failure of the opening operation.

Incidentally, the second operation procedure of the opening operation executed by the load port control unit of the invention may be performed at a slower speed than in the first operation procedure, and the load port control unit may be configured to execute the second operation procedure at least until the lid and the container body of the sealable container separate from each other. In addition, the second operation procedure may be a processing procedure of moving the stage to the undocking position through intermittently repeating very small retreat operations (intermittently repeating retreat operations and stops), and the load port control unit may be configured to execute the second operation procedure at least until the lid and the container body of the sealable container separate from each other. Further, the second operation procedure may be set to move the stage to a predetermined retreat position, and then to advance the stage for the moment by a shorter distance than a distance to the retreat position, and the load port control unit may be configured to execute the second operation procedure at least until the lid and the container body of the sealable container separate from each other.

Further, the load port control unit of the invention causes the door lifting mechanism to raise and lower the load port door within a predetermined operation range in an up-down direction at least until the lid and the container body of the sealable container separate from each other. With the above configuration, since in addition to the operation of advancing and retreating the stage, the operation of raising and lowering the lid of the container in the up-down direction is performed, the lid can be smoothly separated from the container body.

Incidentally, it is desirable that the operation range in the up-down direction of the load port door is a dimension smaller than a dimension in the up-down direction of a gap between the container body and the lid. With the above configuration, it is possible to prevent collision between the container body and the lid caused by the movement in the up-down direction of the lid, or the floating up of the container body caused by the up and down movement. In addition, it is desirable that the operation range is a dimension smaller than a dimension of a gap between the load port door and an airflow adjustment plate (airflow adjustment member) disposed around the load port door. With the above configuration, it is possible to prevent the occurrence of dust caused by collision between the load port door and the airflow adjustment member.

In addition, the various second operation procedures illustrated above can be used in combination as appropriate. Further, when the lid cannot be separated even in the second operation procedure, the configuration can also be such that the various second operation procedures are executed a predetermined number of times. In addition, the configuration can also be such that the second operation procedures are prioritized as appropriate and the various different second operation procedures are executed in priority order. For example, as the second operation procedure, even if the stage is moved at a slower speed than the movement speed of the first operation procedure, when the lid cannot be separated from the container body, an operation of dividing the movement of the stage and intermittently repeating movements and stops can be performed as a third operation procedure. In addition, the configuration may be such that the operation procedures described above as the second operation procedures are prioritized and executed in combination as third and fourth operation procedures.

Effect of the Invention

According to the load port of the invention, even when an abnormality has occurred in the opening operation of the sealable container based on the normal opening operation procedure due to a reason such as a seal member being stuck or friction of the seal member being large, it is possible to prevent a trouble that the entirety of the transfer device stops each time an opening abnormality occurs, and to improve operating efficiency of the entire system by performing the opening process according to the second operation procedure that enables more reliable opening.

BRIEF DESCRIPTION OF DRAWINGS

FIG. 3A is a view of the stage provided in the load port of the present embodiment as viewed from above, and FIG. 3B is a schematic view of an FOUP for describing main parts of the stage as viewed in a side direction;

FIG. 4A is a view of the load port door as viewed from a side on which the stage is disposed, and FIG. 4B is a schematic view of a lid opening and closing mechanism illustrating a state where a latch key is rotated to the left and is unlocked;

FIG. 5A is a perspective view illustrating the FOUP body in which wafers W are accommodated, and the lid separated from the body, FIG. 5B is a perspective view illustrating an inner side of the lid, and FIG. 5C is a view illustrating a bottom surface of the FOUP;

FIG. 7A illustrates a state where the FOUP body and the lid are unlocked, and FIG. 7B is a partial enlarged cross-sectional view illustrating a locked state;

FIGS. 8A and 8B illustrate a state where the lid is not pressed against the FOUP body, and FIG. 8C illustrates a state where the lid is pressed against the FOUP body;

FIG. 9A is a view illustrating a normal state where the FOUP is correctly placed and an optical path is blocked by a detection pin, and FIG. 9B is a view illustrating an error state where a light-receiving unit receives light since the FOUP is inclined;

FIG. 10A is a side view illustrating the FOUP at a docking position, and FIG. 10B is a side view illustrating a state where a rear portion of the FOUP is floated up by an opening operation since the seal member is stuck to a flange;

FIG. 11A is a graph illustrating the elapsed time and the movement distance when the stage is moved according to the first operation procedure, using a solid line, FIG. 11B is a graph illustrating the elapsed time and the movement distance when the opening operation is performed according to the second operation procedure of moving the stage at a slower movement speed than in the first operation procedure, using a solid line, and FIG. 11C is a graph illustrating the case of the second operation procedure of moving the stage to an undocking position while repeating short-distance movements and stops;

FIG. 12A is a graph illustrating an example of the opening operation according to the second operation procedure performed by repeating retreats and advances to the undocking position, and FIGS. 12B and 12C are graphs illustrating the second operation procedure of moving the stage to an unloading position while vibrating the load port door up and down.

MODE(S) FOR CARRYING OUT THE INVENTION

Figure 1:
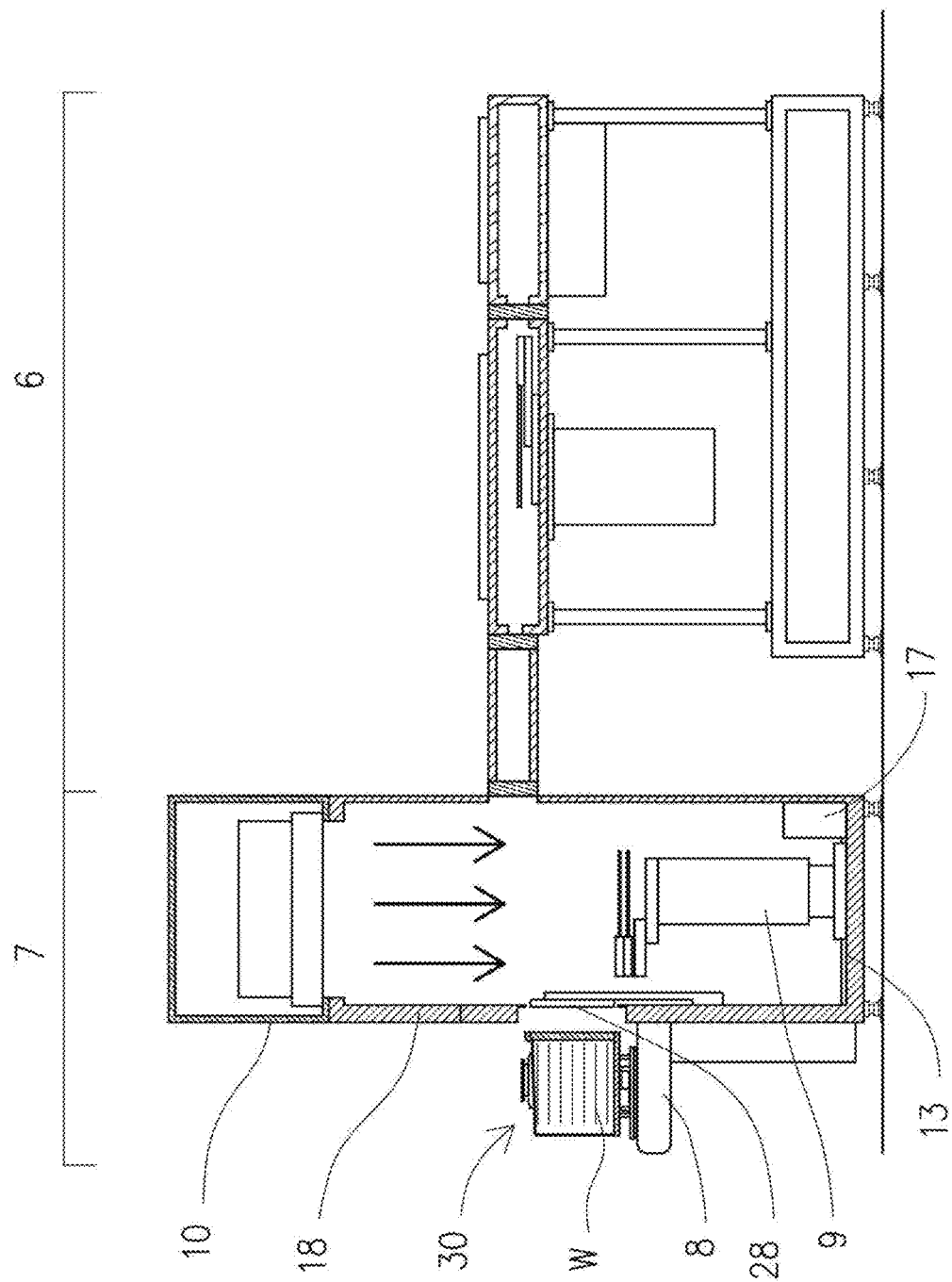
FIG. 1 is a cross-sectional view illustrating an EFEM that is one embodiment of the invention.

Hereinafter, an embodiment of the invention will be described with reference to the drawings. FIG. 1 is a cross-sectional view illustrating an outline of an EFEM 7 which is a transfer device that transfers a wafer W accommodated in an FOUP 30, between the FOUP 30 and a wafer processing device 6 without exposing the wafer W to an external environment. The EFEM 7 includes at least a load port 8 on which the FOUP 30 is placed and which opens and closes a door of the FOUP 30; a transfer robot 9 that extracts the wafer W accommodated inside the FOUP 30, to transfer the wafer W to the processing device; and a fun filter unit (FFU) 10 that supplies clean air to an internal space of the EFEM 7. A transfer operation by collaboration of the load port 8 and the transfer robot 9 is controlled by a control device 17 disposed inside the EFEM 7. Incidentally, only one FOUP 30 is illustrated in FIG. 1; however, a plurality of the FOUPs 30 are usually arranged in a lateral direction in many cases.

The internal space of the EFEM 7 is a clean space covered by a frame 18 and a cover fixed to the frame 18, and the FFU 10 is installed on a top portion of the space. The FFU 10 filters air introduced from the outside by a fan, through a filter, and supplies clean air as a downflow to the internal space of the EFEM 7. Further, a bottom cover 13 with a plurality of openings opened at a predetermined opening rate is disposed on a floor surface of the EFEM 7, and the clean air supplied from the FFU 10 passes through the internal space of the EFEM 7, and is discharged from the openings of the bottom cover 13 to the outside of the EFEM 7. The flow rate of the clean air supplied from the FFU 10 and the opening rate of the bottom cover 13 are adjusted such that the pressure in the internal space of the EFEM 7 becomes higher than external atmospheric pressure, and dust generated outside the EFEM 7 is prevented from flowing into the internal space of the EFEM 7.

Figure 2:
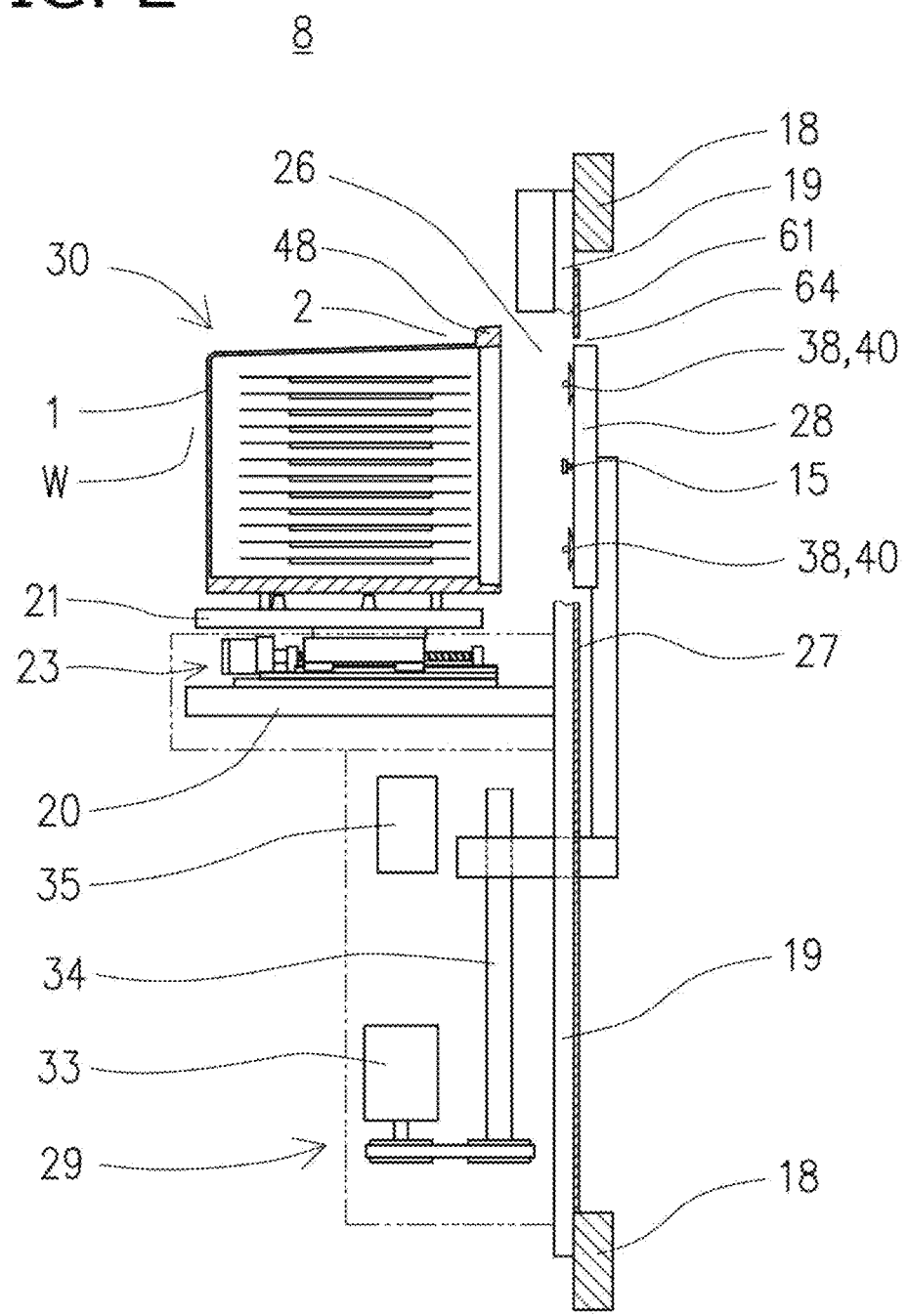
FIG. 2 is a cross-sectional view illustrating a load port that is one embodiment of the invention.
Figure 3A:
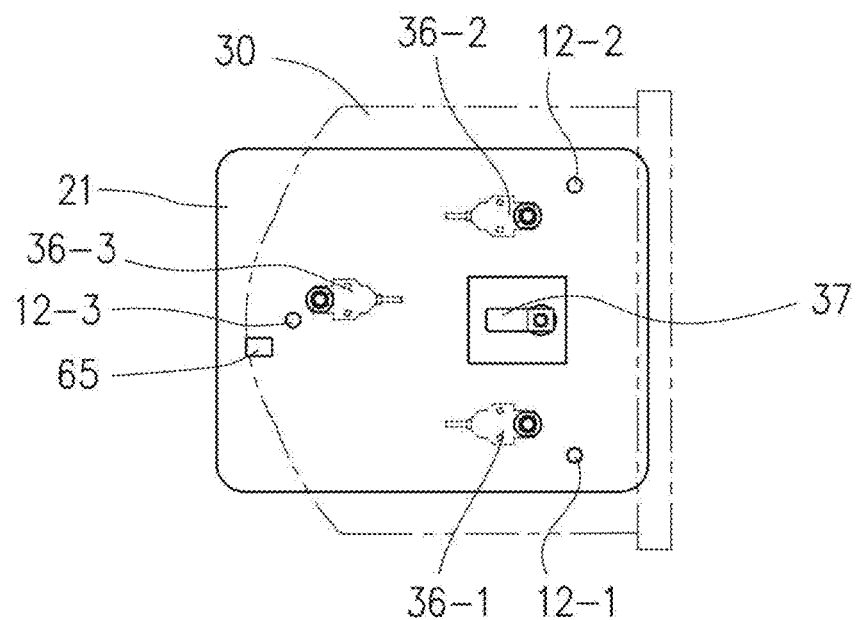
FIG. 3A and FIG. 3B are views illustrating a stage provided in the load port that is one embodiment of the invention.
Figure 3B:
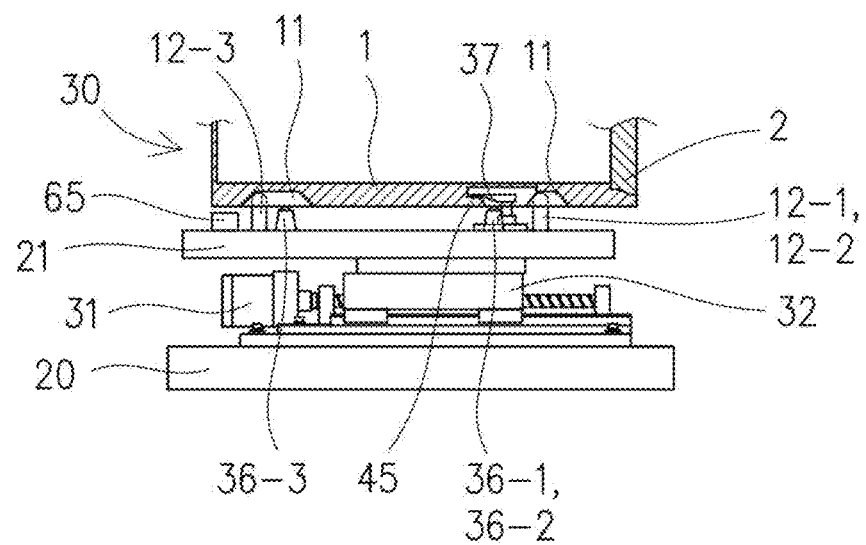

FIG. 2 is a cross-sectional view illustrating the load port 8 according to the embodiment of the invention. In addition, FIG. 3A is a view of a stage 21 provided in the load port 8 of the embodiment illustrated in FIG. 2 as viewed from above, and FIG. 3B is a schematic view of the stage 21 as viewed in a side direction. For convenience of description, only an FOUP body 1 and a lid 2 are illustrated in a cross section. The load port 8 serves as a lid opening and closing device that removes the lid 2 of the FOUP 30 from the FOUP body 1 while preventing penetration of an external atmosphere, and that allows communication between an internal atmosphere of the FOUP 30 and an internal atmosphere of the EFEM 7. Accordingly, the wafer W can be extracted and transferred from the FOUP 30 by the transfer robot 9 without exposing the insides of the FOUP 30 and the EFEM 7 to the external atmosphere.

Referring to FIG. 2, the load port 8 of the present embodiment includes a horizontal frame 20 provided on a body frame 19 that is connected and fixed to the frame 18 of the EFEM 7 in an upright state; the stage 21 that places the FOUP 30 at a predetermined position; a stage drive mechanism 23 that is provided on the horizontal frame 20 and that advances and retreats the stage 21 in a horizontal plane; a plate 27 which is fixed to the body frame 19 and in which a port opening portion 26 through which the wafer W and the lid 2 of the FOUP 30 can pass is formed; a load port door 28 through which the port opening portion 26 can pass and which includes a mechanism that integrates the load port door 28 and the lid 2 of the FOUP 30; and a door lifting unit 29 that raises and lowers the load port door 28.

As illustrated in FIG. 3B, the stage drive unit 23 of the present embodiment includes a motor 31 that is a drive source, and a feed screw mechanism 32 connected to the motor 31. A rotating shaft of the motor 31 and a ball screw shaft of the feed screw mechanism 32 are connected by a known coupling mechanism, and the rotation of the rotating shaft of the motor 31 is transmitted to the ball screw shaft, so that the stage 21 is movable to a predetermined position in a horizontal direction. The stage drive mechanism 23 can move the stage 21 to each position of a docking position where the lid 2 of the FOUP 30 and the load port door 28 are joined and integrated, an undocking position where the FOUP body 1 and the lid 2 separate from each other, a retract position where interference of the stage drive mechanism 23 is prevented during a lowering operation of the load port door 28 after the FOUP body 1 and the lid 2 have separated from each other, and a reference position where the FOUP 30 is handed over to means for transporting the FOUP which is provided in a cleanroom, as examples of the predetermined position.

The door lifting unit 29 includes a motor 33 that is a drive source, and a feed screw mechanism 34 (refer to FIG. 2). Pulleys are each fixed to a rotating shaft of the motor 33 and a ball screw shaft of the feed screw mechanism 34, and a belt is bridged between two pulleys. Accordingly, the rotation of the rotating shaft of the motor 33 is transmitted to the ball screw shaft of the feed screw mechanism 34, so that the load port door 28 is raised and lowered to a predetermined position. Incidentally, it is preferable that the motors 31 and 33 provided in the stage drive unit 23 and the door lifting unit 29 of the present embodiment are stepping motors with the capability of controlling the angle of the rotating shaft, and the operation speed or operation distance of the motors 31 and 33 is controlled by a load port control unit 35 provided in the load port 8. In addition, the drive sources provided in the stage drive mechanism 23 and the door lifting unit 29 may be configured to include known cylinders using fluid pressure such as air pressure or hydraulic pressure, instead of the motors 31 and 33 illustrated in FIGS. 2, 3A and 3B.

Three kinematic pins 12-1, 12-2, and 12-3 that are columnar members supporting the FOUP 30 are erected at predetermined intervals on an upper surface of the stage 21 so as to be each located at vertices of an isosceles triangle in a plan view (refer to FIGS. 3A and 3B). It is preferable that top portions of the kinematic pins 12-1, 12-2, and 12-3 have a substantially hemispherical shape. When the FOUP 30 is placed on the kinematic pins 12-1, 12-2, and 12-3, three V-shaped groove portions 11 formed in a substantially V shape as recesses in a bottom surface of the FOUP 30 and the top portions of the kinematic pins 12-1, 12-2, and 12-3 come into contact with each other, thereby positioning the FOUP 30 at a predetermined position on the stage 21. Further, detection sensors 36-1, 36-2, and 36-3 for detecting whether or not the FOUP 30 is placed at a normal position on the stage 21 are disposed in the vicinities of the kinematic pins 12-1, 12-2, and 12-3, respectively.

Figure 9A:
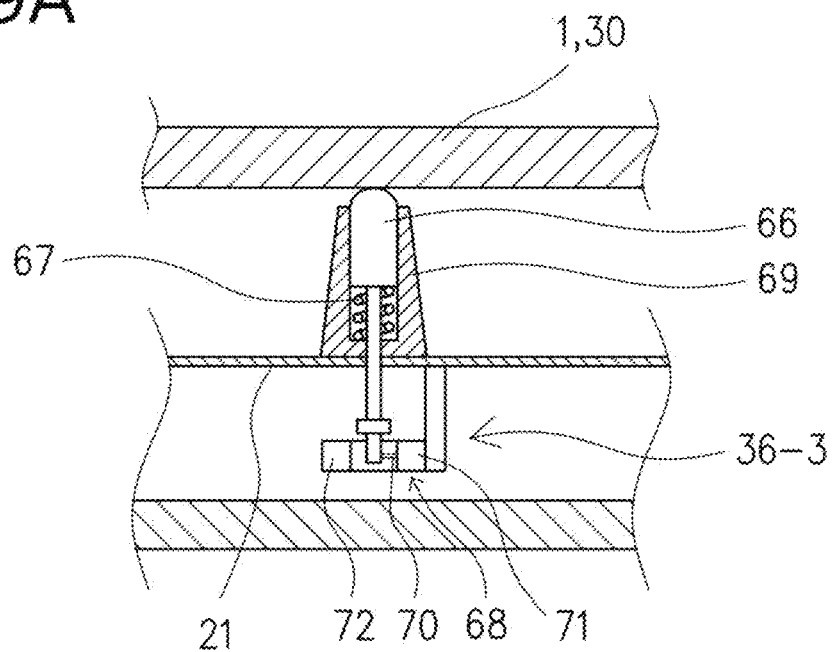
FIG. 9A and FIG. 9B are schematic views illustrating one example of a detection sensor provided in the load port of the invention.
Figure 9B:
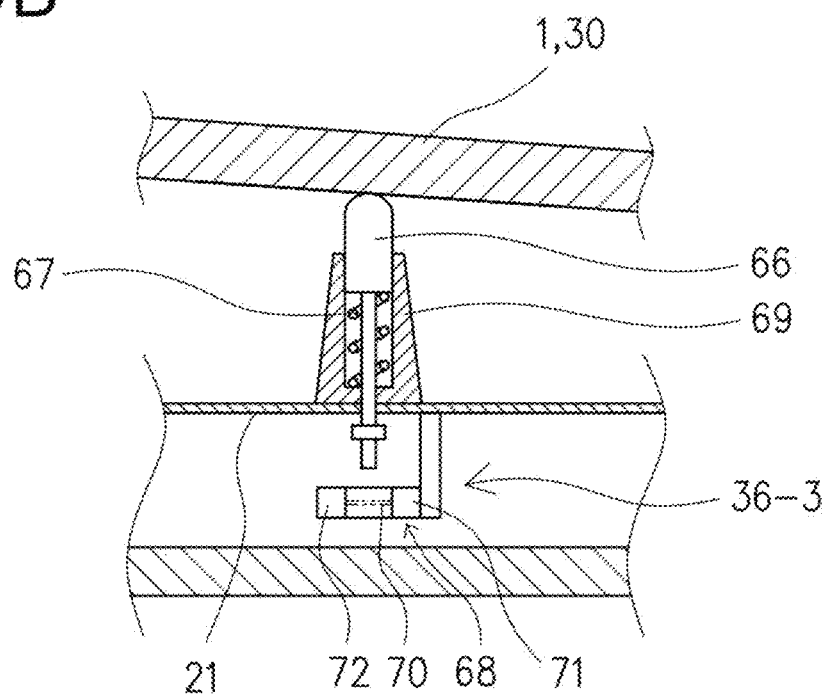

Each of the detection sensors 36-1, 36-2, and 36-3 provided in the load port 8 of the present embodiment is formed of a detection pin, a compression spring that biases the detection pin upward, and a transmissive optical sensor. One example of the detection sensor using the transmissive optical sensor is illustrated in FIG. 9A and FIG. 9B. As illustrated in FIG. 9A, when the FOUP 30 is correctly placed on the kinematic pins 12-1, 12-2, and 12-3, each detection pin 66 is pushed downward by the bottom surface of the FOUP 30, and detection light 70 for irradiation from each light-emitting unit 71 is blocked by each detection pin 66. For this reason, each light-receiving unit 72 cannot detect the detection light 70, and outputs an OFF signal. On the other hand, when the FOUP 30 is not placed, or when the FOUP 30 is not correctly placed as illustrated in FIG. 9B, each detection pin 66 is pushed upward by each compression coil spring 67 and the like, and each light-receiving unit 72 detects the detection light 70, so that an ON signal (received light signal) is output. The ON or OFF signal is transmitted to the load port control unit 35, and the control unit recognizes whether or not the FOUP 30 is correctly placed.

When the FOUP 30 is correctly placed such that the kinematic pins 12-1, 12-2, and 12-3 abut at predetermined positions within the V-shaped groove portions 11 of the FOUP 30, the position of the bottom surface of the FOUP 30 is lowered by a distance equivalent to a depth of the V-shaped groove portions 11. When the FOUP 30 is not correctly placed, the bottom surface of the FOUP 30 is at a higher position than when the FOUP 30 is correctly placed. The detection sensors 36-1, 36-2, and 36-3 transmit OFF signals to the load port control unit 35 when the FOUP 30 is correctly placed, and transmit ON signals to the load port control unit 35 when the FOUP 30 is not correctly placed, based on a difference in the lowering position of the bottom surface of the FOUP 30.

A position in a height direction of the detection sensors 36-1, 36-2, and 36-3 is adjusted such that all the detection sensors 36-1, 36-2, and 36-3 output OFF signals only when the FOUP 30 is normally placed. For example, when the FOUP 30 is placed in an inclined state due to one of the kinematic pins being not correctly placed at the position of the V-shaped groove portion 11, the position in the height direction is adjusted such that at least one of three detection sensors 36-1, 36-2, and 36-3 becomes an ON state. Therefore, the load port control unit 35 can recognize whether or not the FOUP 30 is normally placed on the stage 21, based on the signal transmitted from each of the detection sensors 36-1, 36-2, and 36-3.

In addition, the FOUP 30 placed on the kinematic pins 12-1, 12-2, and 12-3 is locked to the stage 21 by a locking hook 37 (refer to FIG. 3B). The locking hook 37 operates in conjunction with an air cylinder (not illustrated), and when compressed air is supplied to the air cylinder, a piston rod of the air cylinder extends, thereby causing the locking hook 37 to lock the FOUP 30 to the stage 21. In addition, when the compressed air supplied to the air cylinder is released, the piston rod contracts, and the locking hook 37 releases the locking of the FOUP 30. The supply and release of the compressed air to the air cylinder are switched by an electromagnetic valve (not illustrated) provided in the load port 8. The electromagnetic valve is provided in the middle of a pipe that allows communication between a supply source of the compressed air and the air cylinder, and the operation of the electromagnetic valve is controlled by the load port control unit 35.

In addition, the stage 21 can be provided with an ID reader (not illustrated) that reads ID information individually assigned to each FOUP 30 to manage processing steps of the wafer W. Incidentally, as the ID reader, a barcode reader that reads a barcode provided on the FOUP 30, a radio frequency identifier (RFID) reader that sends a radio wave to an ID tag provided on the FOUP 30, and that receives the radio wave sent back from the ID tag, or the like can be used.

Figure 4A:
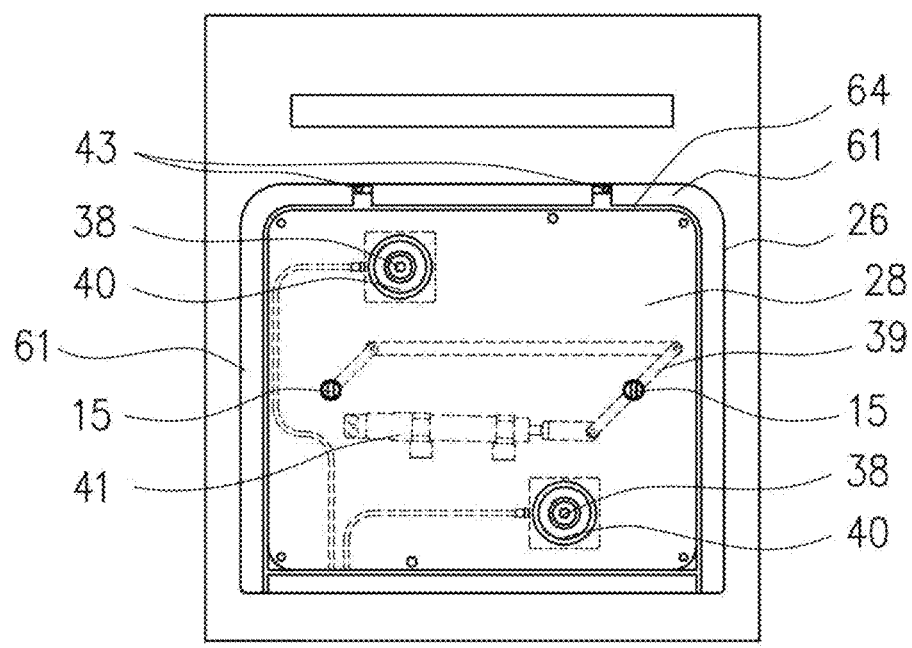
FIG. 4A and FIG. 4B are views illustrating a load port door provided in the load port that is one embodiment of the invention and mechanisms therearound and thereinside.
Figure 4B:
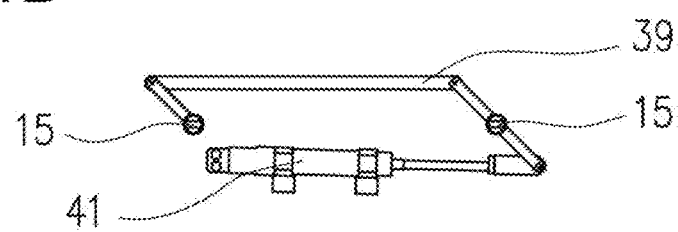

FIG. 4A and FIG. 4B are views illustrating the load port door 28 provided in the load port 8 of the present embodiment and mechanisms therearound, FIG. 4A is a view of the load port door 28 as viewed from a side on which the stage 21 is disposed, and FIG. 4B is a schematic view illustrating a lid opening and closing mechanism 39 in a state where a latch key 15 is rotated to the left and is unlocked. The load port door 28 includes registration pins 38 that position the lid 2 of the FOUP 30 with respect to the load port door 28; the latch key 15 that engages with a locking mechanism 51 (refer to FIG. 6) provided on the lid 2, to lock and unlock the lid 2; and the lid opening and closing mechanism 39 that rotates the latch key 15. The registration pins 38 are substantially columnar members having a diameter of approximately 9 mm and disposed at the upper left and the lower right of the front of the load port door 28 illustrated in FIG. 4A and FIG. 4B. A suction pad 40 made of a flexible material such as silicone rubber is provided around each of the registration pins 38. Further, flow paths for suctioning (vacuum suctioning) the lid 2 are formed in the registration pins 38, and the flow paths are connected to a vacuum source (not illustrated) provided outside the device. The lid 2 of the FOUP 30 which has come into contact with the load port door 28 is positioned at a predetermined position with respect to the load port door 28 by the registration pins 38, and the lid 2 is suctioned by a vacuum suction force from the vacuum source, and the load port door 28 and the lid 2 are integrated.

The latch key 15 is a substantially T-shaped member disposed to protrude from a surface of the load port door 28, and a pair of the latch keys 15 are provided at the left and the right of the front of the load port door 28. Each of the latch keys 15 is rotated clockwise and counterclockwise by the lid opening and closing mechanism 39 provided inside the load port door 28. The lid opening and closing mechanism 39 of the present embodiment includes an air cylinder 41 as a drive source, and when a piston rod of the air cylinder 41 advances and retreats, a cam mechanism 42 connected to the piston rod rotationally operates the latch keys 15 in conjunction therewith. Incidentally, the supply and release of compressed air to the air cylinder 41 are controlled by the load port control unit 35. According to the above configuration, when the load port door 28 and the lid 2 are integrated and then the latch keys 15 rotate in a predetermined direction, the lid 2 is unlocked and can be separated from the FOUP body 1. In addition, when the latch keys 15 rotate in an opposite direction, the lid 2 of the FOUP 30 is locked not to be separable from the FOUP body 1.

In addition to the above configuration, the load port 8 is provided with a mapping sensor 43 that detects whether or not the wafer W is accommodated on each shelf formed inside the FOUP 30 (refer to FIG. 4A). As the mapping sensor 43 provided in the load port 8 of the present embodiment, a transmissive optical sensor is used with a light source and a light-receiving unit disposed at an interval on the left and the right. The mapping sensor 43 of the present embodiment is attached to the load port door 28 in a state where the mapping sensor 43 is swingable in an inside direction of the FOUP body 1. The mapping sensor 43 is configured such that when the load port door 28 is lowered to a predetermined height position, both the light source and the light-receiving unit disposed at the left and the right of the mapping sensor 43 penetrate toward the inside of the FOUP body 1 to the extent that the light source and the light-receiving unit do not come into contact with the wafer. In that state, when the mapping sensor 43 is lowered together with the load port door 28 by the door lifting unit 29, the mapping sensor 43 sequentially detects the presence and absence of the wafer W on each shelf board by detecting whether or not light of the light source is blocked by an edge of the wafer W placed on each shelf board. An air cylinder (not illustrated) is provided as a drive source of a sensor drive mechanism that advances and retreats the mapping sensor 43 in the inside direction of the FOUP body 1. Incidentally, the drive of the mapping sensor 43 and each drive mechanism such as the door lifting unit 29 are controlled by the load port control unit 35, and a detection signal of the mapping sensor 43 is input to the load port control unit 35. The presence and absence of the wafer W can be detected for all the shelves inside the FOUP body 1 from the detection signal of the mapping sensor 43.

Figure 5A:
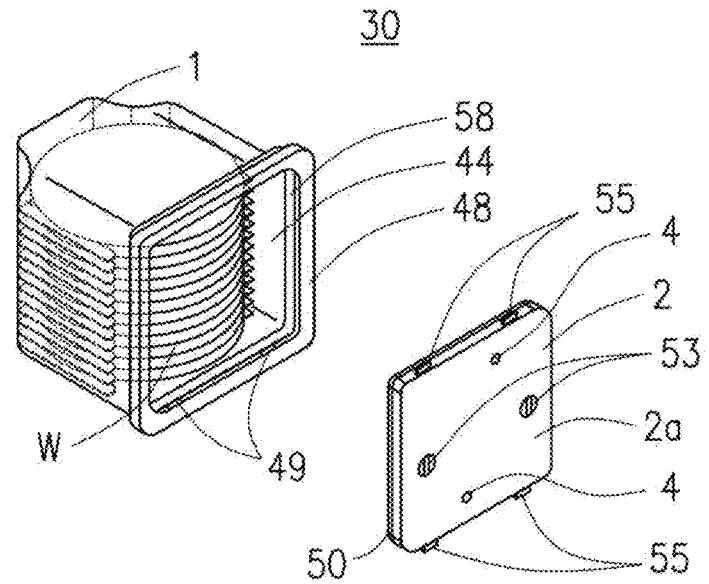
FIG. 5A, FIG. 5B and FIG. 5C are views illustrating an FOUP body and a lid used in the invention.
Figure 5B:
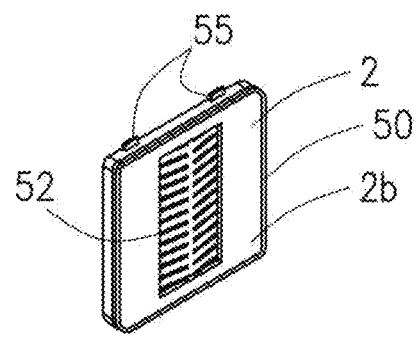
Figure 5C:
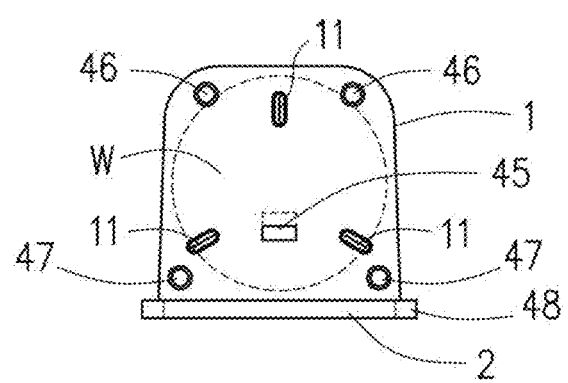

Next, the FOUP 30 that is a sealable container accommodating the wafers W will be described. FIG. 5A is an exploded perspective view illustrating the FOUP body 1 in which the wafers W are accommodated, and the lid 2, and FIG. 5B is a perspective view illustrating an inner side of the lid 2. FIG. 5C is a view illustrating the bottom surface of the FOUP 30. The FOUP 30 is formed of the FOUP body 1 that accommodates the wafers W on the shelf boards formed at intervals in an up-down direction, and the lid 2 that airtightly closes the FOUP body 1. An opening 44 for loading and unloading the wafer W is formed in one side surface of the FOUP body 1, and the opening 44 is closed by the lid 2. The three V-shaped groove portions (positioning grooves) 11 which are formed in a substantially V shape and which each come into contact with the kinematic pins 12-1, 12-2, and 12-3 to specify the position of the FOUP 30 with respect to the stage 21 are disposed in a bottom portion of the FOUP body 1 at predetermined positions. In addition, an engagement portion 45 is formed in the bottom portion of the FOUP body 1, and when the engagement portion 45 engages with the locking hook 37 (FIG. 3B) of the stage 21, the FOUP body 1 is fixed to the stage 21. Incidentally, an injection port 46 for injecting purge gas to replace the internal atmosphere of the FOUP 30 and a discharge port 47 for discharging gas remaining inside the FOUP 30 to the outside of the FOUP 30 are provided in the bottom portion of the FOUP body 1 as necessary.

Further, an opening flange 48 formed to surround the opening 44 is provided at a peripheral edge of the opening 44 of the FOUP body 1. Recessed portions 49 for inserting locking members 55 of the lid 2 to be described later are provided in surfaces at an upper end and a lower end of the opening flange 48, the surfaces facing the opening 44. In addition, a seal member 50 is provided on an FOUP body 1 side of a peripheral edge of the lid 2, and when the seal member 50 comes into close contact with a second flat surface 58 (refer to FIG. 7A and FIG. 7B) formed on an inner side of the opening flange 48, an internal space of the FOUP body 1 is airtightly closed.

The lid 2 is formed of a front plate 2a and a back plate 2b fitted to each other, and the locking mechanism 51 (refer to FIG. 6) for locking and unlocking the FOUP body 1 and the lid 2 is provided between the front plate 2a and the back plate 2b. In addition, as illustrated in FIG. 7A and FIG. 7B, the seal member 50 and a groove portion that fixes the seal member 50 with the seal member 50 sandwiched between the front plate 2a and the back plate 2b are provided at the peripheral edge of the lid 2, and the seal member 50 maintains sealability between the FOUP body 1 and the lid 2. Further, the back plate 2b is provided with a retainer 52 for fixing the wafers W, which are accommodated in the FOUP body 1, at predetermined positions (refer to FIG. 5B). The front plate 2a is provided with registration pin holes 4 into which the registration pins 38 provided on the load port door 28 are inserted, and with latch key holes 53 for engaging with the latch keys 15 of the lid opening and closing mechanism 39 to be described later.

Figure 6:
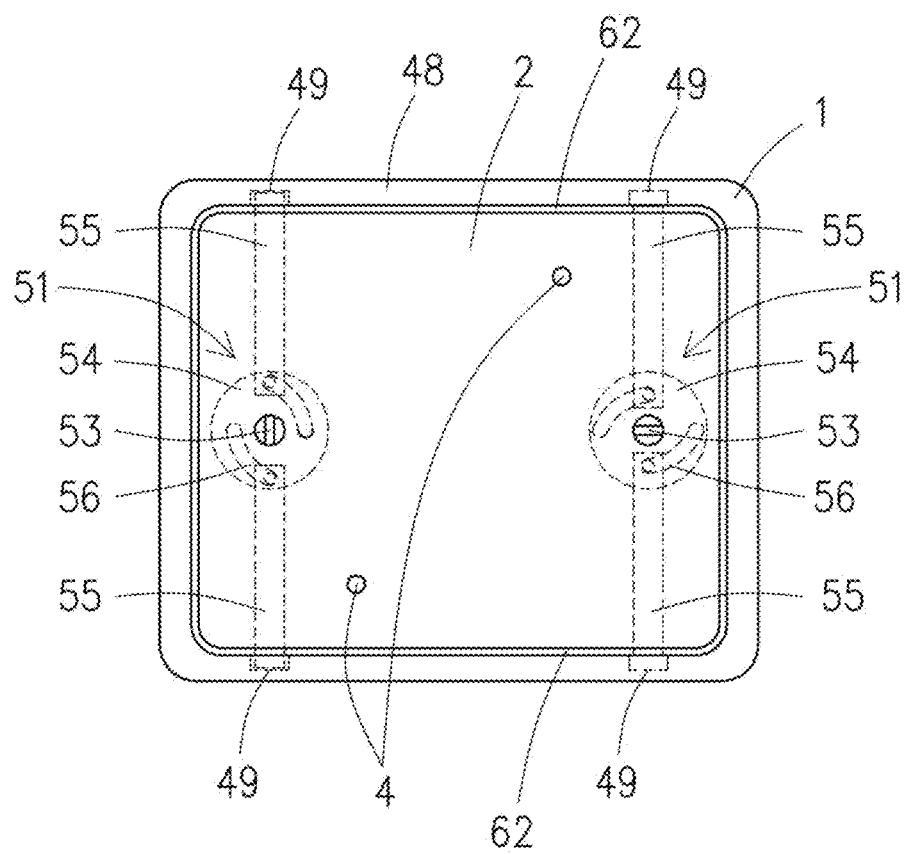
FIG. 6 is a view illustrating an internal structure of the lid used in the invention.
Figure 7A:
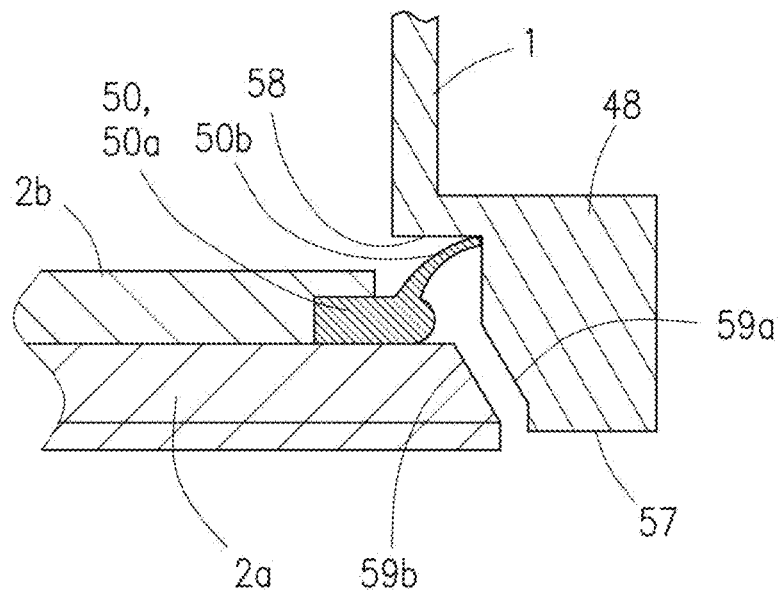
FIG. 7A and FIG. 7B are partial enlarged cross-sectional views illustrating the position of the lid with respect to the FOUP body and the state of a seal member.
Figure 7B:
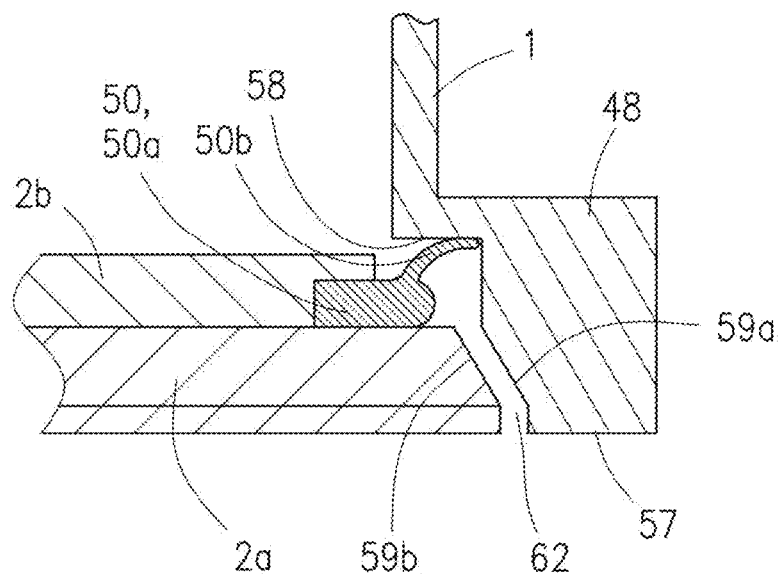

FIG. 6 is a view illustrating an internal structure of the lid 2. The locking mechanism 51 disposed inside the lid 2 is formed of two disk-shaped members 54 that are each disposed at positions corresponding to the latch keys 15 provided on the load port door 28, and the locking members 55 that are disposed at a top and a bottom of the disk-shaped member 54 and that move up and down in conjunction with a rotational operation of the disk-shaped member 54. Cam grooves 56 are provided in each of the disk-shaped members 54 at two locations over a range of approximately 90° in a circumferential direction of the disk-shaped member 54. The distance in a radial direction of each cam groove 56 from a rotation center of the disk-shaped member 54 is formed to increase as the disk-shaped member 54 advances in a clockwise direction in the drawing view.

In addition, a proximal end portion of the locking member 55 is connected to the cam groove 56 via a connection pin. In addition, the locking members 55 are disposed inside the lid 2 so as to be movable in a vertical direction, and according to the above configuration, the rotation of the disk-shaped member 54 by 90° clockwise causes peripheral edge portions of the cam grooves 56 to push the connection pins. Accordingly, distal end portions of the locking members 55 protrude with respect to an upper surface and a lower surface of the lid 2 to enter the recessed portions 49 of the opening flange 48, so that the FOUP 30 and the lid 2 are locked. In addition, the rotation of the disk-shaped member 54 by 90° counterclockwise causes the peripheral edge portions of the cam grooves 56 to draw the connection pins inward, thereby causing the distal end portions of the locking members 55 to retreat. Accordingly, the locking members 55 retract from the recessed portions 49 of the opening flange 48, so that the FOUP 30 and the lid 2 are unlocked.

The latch key holes 53 having a substantially oblong shape are each provided at the centers of the disk-shaped members 54. When the FOUP 30 fixed on the stage 21 of the load port 8 is advanced by the stage 21 and comes into contact with the load port door 28, distal end portions of the latch keys 15 disposed on the load port door 28 are fitted to the latch key holes 53. Then, when the lid opening and closing mechanism 39 operates, the latch keys 15 and the disk-shaped members 54 rotate forward, and the FOUP 30 and the lid 2 are unlocked. In addition, when the lid opening and closing mechanism 39 operates in the opposite direction, the latch keys 15 and the disk-shaped members 54 rotate reversely and the FOUP 30 and the lid 2 are locked.

FIG. 7A and FIG. 7B are partial enlarged cross-sectional views illustrating the state of the seal member 50 with respect to the FOUP body 1 when the lid 2 is unlocked or locked, FIG. 7A is a view illustrating a state where the FOUP body 1 and the lid 2 are unlocked, and FIG. 7B is a view illustrating a state where the FOUP body 1 and the lid 2 are locked. The seal member 50 provided on an outer peripheral surface of the lid 2 is molded from materials such as various thermoplastic elastomers and fluorine rubber. The seal member 50 is formed of an endless portion 50a and a lip portion 50b. The endless portion 50a is fitted to the groove portion formed between the front plate 2a and the back plate 2b, and the lip portion 50b protrudes from the endless portion 50a. The lip portion 50b is molded such that the thickness of the lip portion 50b is gradually thinned from a root portion to a distal end portion and the distal end portion obliquely protrudes toward an outer side in the inside direction of the FOUP body 1. When the lid 2 is fitted to the FOUP body 1, the lip portion 50b and an inner wall of the FOUP body 1 come into contact with each other, so that the internal space of the FOUP body 1 is sealed. In addition, a gap 62 is provided between the lid 2 and the FOUP body 1 that are integrated. The gap 62 is provided at an outer periphery of the lid 2, and the dimension of the gap between the FOUP body 1 and the lid in the present embodiment is L2.

As illustrated in FIG. 7A and FIG. 7B, a first flat surface 57 formed on the opening flange 48 of the FOUP body 1 and the second flat surface 58 formed at a deeper position than the first flat surface 57 and having a smaller area than the first flat surface 57 are formed at the peripheral edge of the opening 44 of the FOUP body 1. In addition, the first flat surface 57 and the second flat surface 58 are formed in a stepped manner, and an inclined surface 59a is formed between the first flat surface 57 and the second flat surface 58 such that the opening area gradually increases from the inside of the FOUP 30 to the outside. In addition, an inclined surface 59b facing outward and corresponding to the inclined surface 59a is formed on the lid 2, and the inclined surfaces 59a and 59b function as guides to smoothly fit the lid 2 to the FOUP body 1 when the lid 2 and the FOUP body 1 are fitted.

Figure 8A:
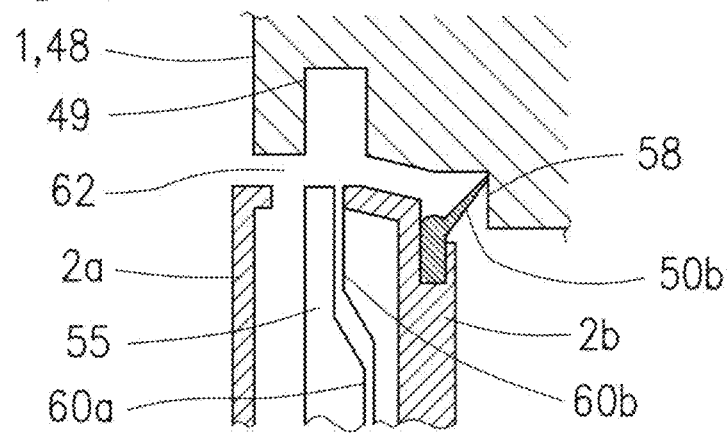
FIG. 8A, FIG. 8B and FIG. 8C are partial enlarged cross-sectional views illustrating a structure of a biasing mechanism that presses the lid against the FOUP.
Figure 8B:
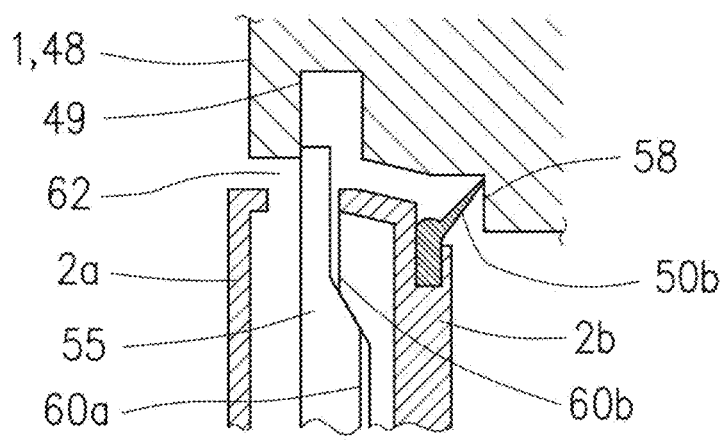
Figure 8C:
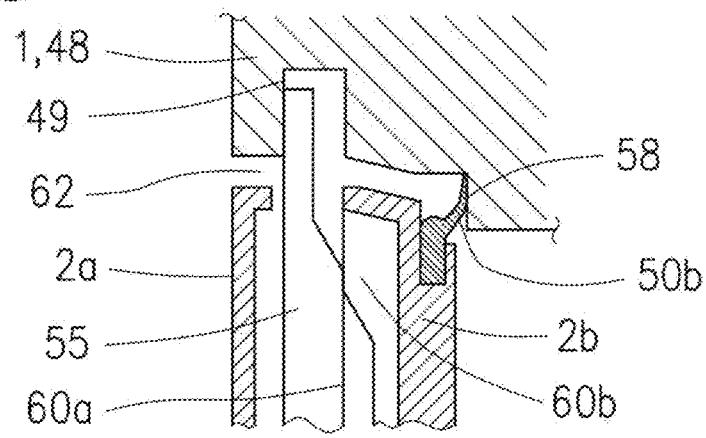

In addition, a biasing mechanism that biases the lid 2 in a direction in which the lid 2 is pressed toward the FOUP body 1 when locking is performed is provided inside the lid 2. FIG. 8A, FIG. 8B and FIG. 8C are partial enlarged cross-sectional views illustrating a structure of the biasing mechanism, and illustrates a state where the locking member 55 enters or retracts from the recessed portion 49 of the opening flange 48 when locking or unlocking is performed. FIG. 8A illustrates a state where the lid 2 and the FOUP body 1 are not locked and the lip portion 50b of the seal member 50 has come into contact with the second flat surface 58 of the FOUP body 1. When, as a result of the rotation of the latch key 15, the locking member 55 protrudes from the lid 2 from a state where the locking member 55 is sunken into the lid 2, and moves to a position where the locking member 55 enters the recessed portion 49, a protrusion portion 60a provided on the locking member 55 comes into contact with a protrusion portion 60b provided on the back plate 2b, and a distal end of the locking member 55 is biased in a direction away from the FOUP body 1 (refer to FIG. 8B). Further, when the locking member 55 protrudes from the lid 2, the distal end of the locking member 55 abuts a wall surface of the recessed portion 49 of the FOUP body 1, and the lid 2 is biased in a direction in which the lid 2 is pressed in the inside direction of the FOUP body 1 (refer to FIG. 8C). The lid 2 is pressed toward a deep location of the FOUP body 1 by a biasing force, the lip portion 50b of the seal member 50 is also pressed against the second flat surface 58 of the FOUP body 1, and the lip portion 50b comes into close contact with the second flat surface 58 while deforming. Accordingly, the internal space of the FOUP 30 is sealed.

The seal member 50 is molded from a flexible material such as fluorine rubber or silicone rubber, and once the FOUP body 1 and the lid 2 are locked, the lip portion 50b of the seal member 50 may stick to the second flat surface 58 of the FOUP body 1. Further, when there is a variation in the processing accuracy of the seal member 50, a trouble occurs that the lip portion 50b comes into contact with a wall of a peripheral edge of the second flat surface 58 and the lid 2 of the FOUP 30 cannot be smoothly opened, thereby causing a malfunction of the load port 8. Further, the FOUP 30 is often used over a long period of time, and due to use for a long period of time, the seal member 50 may deteriorate or the FOUP body 1 may deform. Such deterioration of the seal member 50 or such deformation of the FOUP body 1 becomes resistance during opening operation, and in the case of attempting to forcibly open the lid 2, a trouble occurs, for example, that the FOUP body 1 is floated up. When such a trouble has occurred, it is necessary to collect the FOUP 30 in which the problem has occurred and to replace the seal member 50 or to perform maintenance on the FOUP body 1.

Figure 10A:
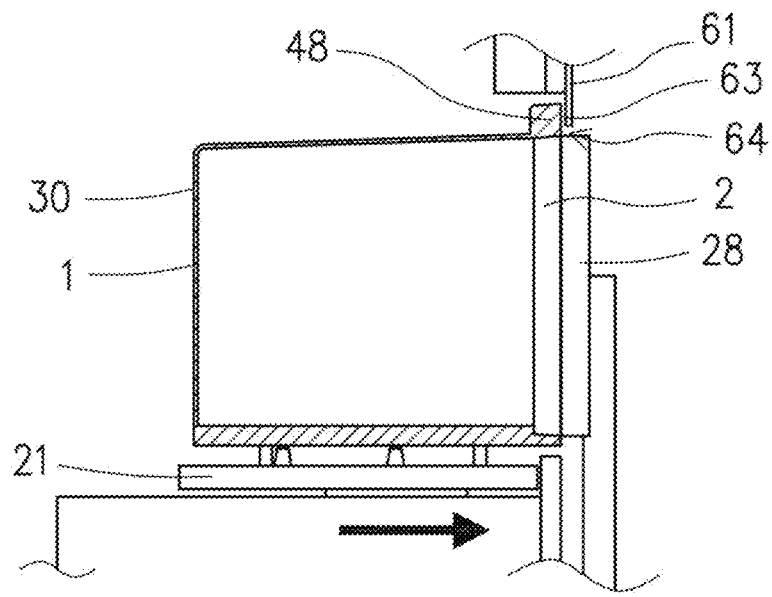
FIG. 10A and FIG. 10B are views illustrating a placement state of an FOUP 30.
Figure 10B:
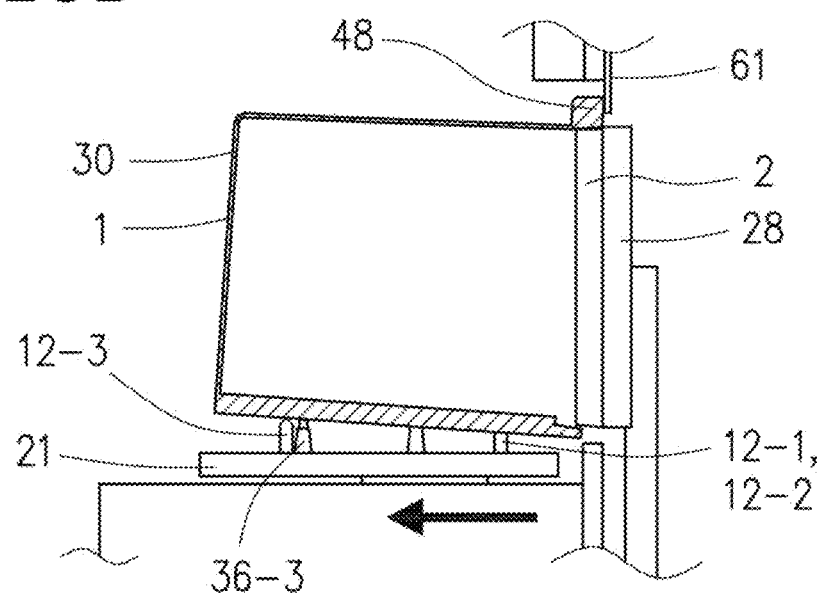

FIG. 10A and FIG. 10B are side views for describing an abnormal operation state of the FOUP 30 when the load port 8 opens the FOUP 30 in a state where the seal member 50 has stuck to the second flat surface 58. First, as illustrated in FIG. 10A, the stage 21 of the load port 8 on which the FOUP 30 is placed is advanced toward the load port door 28, and the lid 2 and the load port door 28 are brought into contact with each other. In the load port 8 of the present embodiment, the position of the stage 21 and the load port door 28 where the lid 2 and the load port door 28 are integrated is referred to as the docking position. Incidentally, when the stage 21 is at the docking position, an airflow adjustment member 61 disposed at a peripheral edge of the load port door 28 is not in contact with the opening flange 48 of a peripheral edge of the FOUP 30, and the airflow adjustment member 61 and the opening flange 48 are located to face each other with a predetermined gap 63 in the horizontal direction.

Next, after the load port door 28 and the lid 2 are integrated and the lid 2 is unlocked, the stage 21 retreats from the docking position illustrated in FIG. 10A to remove the lid 2 from the FOUP body 1. Here, when the FOUP body 1 and the lid 2 can be normally separated from each other, the position where the FOUP body 1 and the lid 2 are recognized as having completely separated from each other is referred to as the undocking position. In addition, even in the FOUP 30 in which the lip portion 50b is stuck to the second flat surface 58, if the lip portion 50b has separated from the second flat surface 58 until the stage 21 reaches the undocking position, this case is not detected as a placement abnormality.

When the lid is normally separated by the movement to the undocking position, the stage 21 continues to retreat and moves to the retract position. When the lid 2 is removed, the transfer robot 9 inserts a finger into the FOUP body 1 to carry out the wafer W accommodated in the FOUP body 1. The lid 2 and the load port door 28 are lowered to a position where interference with operation of the finger at this time is prevented. The retract position of the stage 21 is a position where the stage 21 does not interfere with the downward movement of the lid 2 and the load port door 28.

When the stage 21 retreats to the undocking position, even if the FOUP body 1 has moved to the undocking position, the lip portion 50b of the seal member 50 may not be separated from the second flat surface 58, and the lid 2 and the FOUP body 1 may not be smoothly separated from each other. In that case, since the opening flange 48 of the FOUP body 1 is stuck to the lid 2 and is not movable backward, as illustrated in FIG. 10B, the FOUP body 1 takes on a posture that is inclined forward with two kinematic pins 12-1 and 12-2 in the front as pivot points. Namely, the rear portion of the FOUP body 1 takes on a posture that is floated up from the kinematic pin 12-3 disposed at the rear of the stage 21.

When the rear portion of the FOUP body 1 is floated up, the detection sensor 36-3 disposed in the vicinity of the kinematic pin 12-3 outputs an ON signal. When the load port control unit 35 receives the ON signal from the detection sensor 36-3 at this timing, the load port control unit 35 recognizes that an error has occurred during opening operation, and transmits an error generation signal to the control device 17 of the EFEM 7. In such a manner, when the FOUP body 1 is inclined, a trouble occurs that the opening flange 48 of the FOUP body 1 and the airflow adjustment member 61 come into contact with each other (refer to FIG. 10B) and dust generated during contact adheres to the wafers W accommodated in the FOUP body 1, which is a risk. In addition, there is also a possibility that as a result of the separation of the lip portion 50b from the second flat surface 58 from the state where the rear portion of the FOUP body 1 takes on a float-up posture, the rear portion of the FOUP body 1 falls on the kinematic pin 12-3 and the wafers W accommodated in the FOUP body 1 are damaged by the impact. For this reason, when such a trouble frequently occurs, the control device 17 stops a transfer operation of the EFEM 7. Incidentally, such a trouble is a trouble that can occur similarly even in the load port 8 of a mode in which the lid 2 is removed from the FOUP body 1 by retreating the load port door 28 and the lid 2 with respect to the FOUP body 1 instead of retreating the stage 21.

The above trouble occurs when the time taken for the stage 21 to move from the docking position to the undocking position is shorter than the time taken for the stuck lip portion 50b to separate from the second flat surface 58. Since the lip portion 50b is a member made of a flexible material, even when the stage 21 retreats to the undocking position, a part of the lip portion 50b is stuck to the second flat surface 58, and the stuck lip portion 50b is gradually peeled off from the second flat surface 58, so that the separation of the lid 2 is delayed. Therefore, in the load port 8 of the present embodiment, when the detection sensor 36-3 detects that the rear portion of the FOUP body 1 is floated up, the load port control unit 35 that has received the signal executes an operation for restoring the FOUP body 1 to an original normal placement state (state illustrated in FIG. 10A) by returning the stage 21 to the docking position for the moment. Thereafter, for example, an operation is executed to separate the FOUP body 1 and the lid 2 from each other while preventing the FOUP body 1 from being floated up, such as retreating the stage 21 according to a second operation procedure in which the operation speed is slower than a normal operation speed.

Incidentally, from the viewpoint of preventing the reduction in the transfer throughput of the entirety of the EFEM 7, it is desirable that an opening operation is performed according to a first operation procedure which is a normal operation procedure when a placement abnormality such as the FOUP 30 being floated up has not occurred, and an opening operation is executed according to the second operation procedure only when a placement abnormality has occurred. In addition, when a placement abnormality has occurred, it is desirable that the stage 21 is retreated to the undocking position according to the second operation procedure to reliably separate the FOUP body 1 and the lid 2 from each other, and an operation after the successful separation is performed to move the stage 21 to the retract position according to the normal first operation procedure in which the speed is high. Accordingly, the reduction in the throughput of the entire opening operation can be suppressed.

Further, when the control device 17 receives an error signal indicating the floating up of the FOUP 30 from the load port control unit 35, the control device 17 transmits an alarm signal (error signal) and ID information of the FOUP 30 to a host computer that manages wafer processing steps in the cleanroom. The error signal transmitted to the host computer is transmitted to a worker in the cleanroom, and the worker can prevent the recurrence of the trouble by executing a repair of the FOUP 30 in which the problem has occurred.

FIG. 9A and FIG. 9B are cross-sectional views illustrating the detection sensor 36-3. The detection sensor 36-3 includes the detection pin 66; the compression coil spring 67 that biases the detection pin 66 upward; a transmissive optical sensor 68; and a housing 69 that is fixed on the stage 21 and that accommodates the detection pin 66 and the compression coil spring 67. When the FOUP 30 is correctly placed on the kinematic pins 12-1, 12-2, and 12-3, as illustrated in FIG. 9A, the compression coil spring 67 is compressed by the load of the FOUP 30, and the detection pin 66 is pushed downward by the FOUP 30 to block the detection light 70 for irradiation from the light-emitting unit 71 of the transmissive optical sensor 68. Accordingly, the light-receiving unit 72 does not detect the detection light 70, and the detection sensor 36-3 outputs an OFF signal. The OFF signal from each of the detection sensors 36-1, 36-2, and 36-3 is transmitted to the load port control unit 35, and when the OFF signals are transmitted from all the detection sensors, the load port control unit 35 recognizes that the FOUP 30 is correctly placed.

When a rear portion of the FOUP 30 is floated up, as illustrated in FIG. 9B, the detection pin 66 is biased upward by the compression coil spring 67. At this time, the detection light 70 for irradiation from the light-emitting unit of the transmissive optical sensor 68 reaches the light-receiving unit 72, the transmissive optical sensor 68 becomes a light reception state, and the detection sensor outputs an ON signal. The ON signal is transmitted to the load port control unit 35, and the load port control unit 35 recognizes that the FOUP 30 is not placed or that the FOUP 30 is not correctly placed. It is preferable that the dimension in the up-down direction and the movable range of the detection pin 66 are configured such that the compression coil spring 67 bears the load of the rear portion of the FOUP 30 and supports the bottom surface of the FOUP 30 even when the bottom surface is floated up. Even when the rear portion of the FOUP 30 is floated up, the compression coil spring 67 bears the load of the FOUP 30, so that the falling speed of the rear portion of the FOUP 30 can be reduced, and the impact caused by the fall can be reduced. Incidentally, it is desirable that the compression coil spring 67 provided in the detection sensor 36-3 of the present embodiment has enough elastic force to cause the detection pin 66 to block the detection light 70 of the transmissive optical sensor 68 even when the FOUP body 1 which does not accommodate any wafer W is placed.

Further, as illustrated in FIG. 3A and FIG. 3B, as means for detecting that the FOUP body 1 is floated up, a detection sensor 65 other than the detection sensor 36-3 which is disposed in the vicinity of the kinematic pin 12-3 may be added. As the detection sensor 65, for example, a proximity sensor, a photo sensor, a photoelectric sensor, or the like can be used. The detection sensor 65 may be any form of detection sensor; however, it is desirable that a detection sensor having a higher detection accuracy than the detection sensor 36-3 is used. For example, in the case where the detection sensor 36-3 detects a placement abnormality when the rear portion of the FOUP body 1 is floated up by 2 mm, since the detection sensor 65 can detect even a float-up amount less than 2 mm, so that the floating up of the FOUP body 1 can be accurately detected.

Figure 11A:
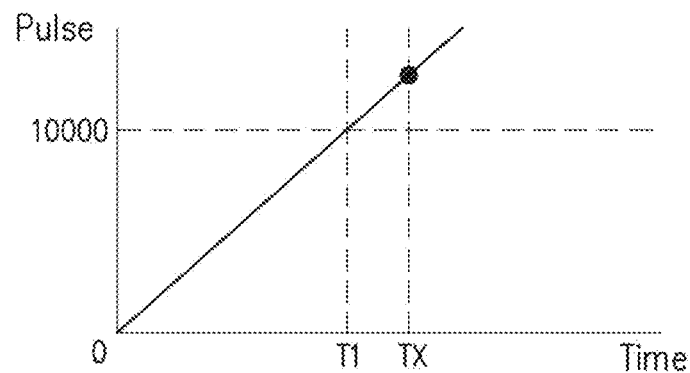
FIG. 11A, FIG. 11B and FIG. 11C are graphs comparatively illustrating effects of opening operations according to a first operation procedure and a second operation procedure.
Figure 11B:
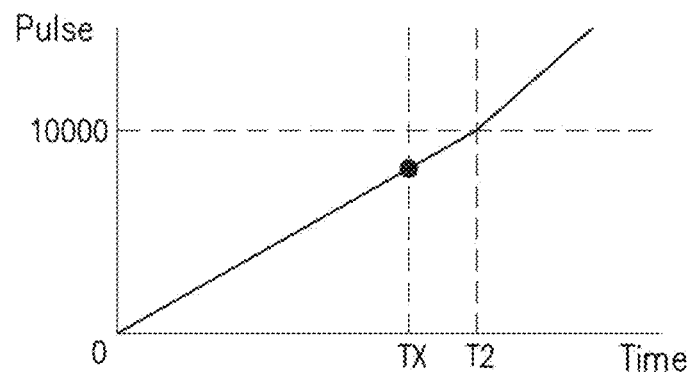

FIG. 11A is a graph illustrating the elapsed time and the movement distance when the stage 21 is moved from the docking position to the undocking position according to the first operation procedure in the case where it is difficult to smoothly separate the lid from the FOUP body due to sticking of the seal member, using a solid line. FIG. 11B is a graph illustrating the elapsed time and the movement distance when the stage 21 is moved from the docking position to the undocking position according to the second operation procedure in which the movement speed is slower than in the first operation procedure, similarly in a state where it is difficult to separate the lid, using a solid line. In both graphs, the horizontal axis and the vertical axis represent time and movement distance, respectively, and the movement distance is represented by the number of operation pulses of the motor 31. In the motor 31 of the present embodiment, as one example, the number of pulses of the motor 31 when the stage 21 is at the docking position is 0 pulses, and the number of pulses when the stage 21 is moved from the docking position to the undocking position by rotating the rotating shaft of the motor 31 forward is 10000 pulses. Further, a point on each graph indicates a time TX that the lip portion 50b has separated from the second flat surface 58, the time that the stage 21 has moved to the undocking position (position of 10000 pulses) according to the first operation procedure is represented as T1, and the time that the stage 21 has moved to the undocking position (position of 10000 pulses) according to the second operation procedure is represented by T2.

Figure 13:
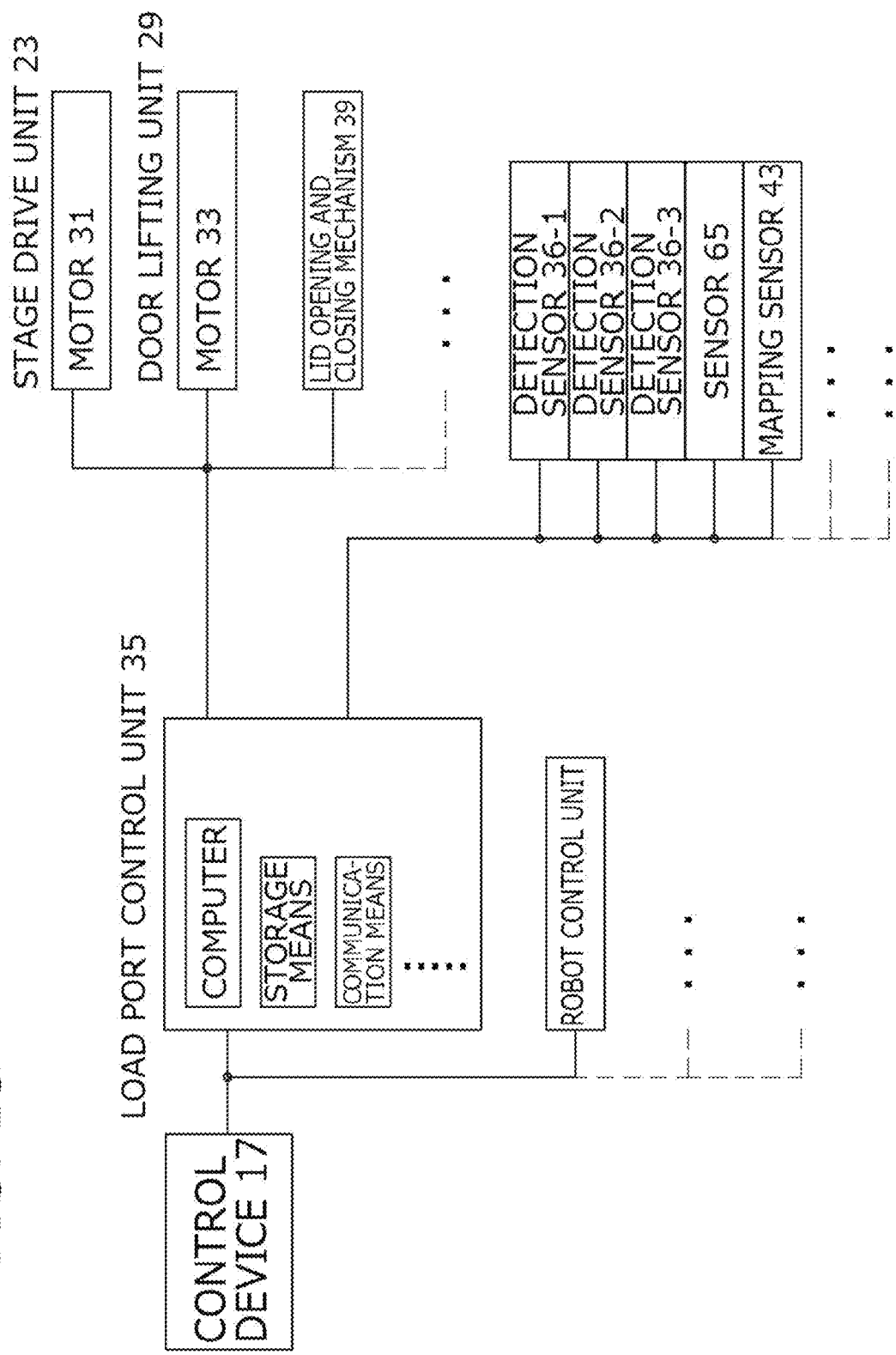
FIG. 13 is a block diagram illustrating a part of a configuration of the load port according to one embodiment of the invention.

In FIG. 11A, in the first operation procedure that is a normal opening operation, even when the stage 21 has finished moving to the undocking position, the lip portion 50b is not separated from the second flat surface 58, and the rear portion of the FOUP body 1 takes on a float-up posture, which results in an error. On the other hand, as illustrated in FIG. 11B, in the second operation procedure of moving the stage 21 at a slower speed than in the first operation procedure, since the lip portion 50b has separated from the second flat surface 58 before the stage 21 moves to the undocking position, the rear portion of the FOUP body 1 is not floated up, and no error occurs. The switching from the first operation procedure to the second operation procedure is performed by the load port control unit 35. As illustrated in FIG. 13, the load port control unit 35 includes a computer that performs various calculations; storage means for storing various setting data or instruction data and an operation program; and communication means for transmitting and receiving signals between drive devices and various sensors provided in the load port 8. When the load port control unit 35 receives signals from the detection sensors 36-1, 36-2, and 36-3, the load port control unit 35 switches from the first operation procedure to the second operation procedure and executes the opening operation of the FOUP 30 according to the operation program stored in the storage means.

Figure 11C:
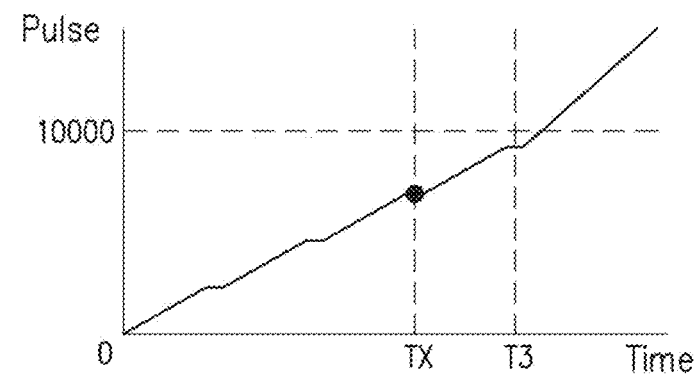

In addition, the opening operation according to the second operation procedure may be a mode in which when the load port control unit 35 causes the stage 21 to move from the docking position to the undocking position, the stage 21 is moved to the undocking position while repeating short-distance retreats and stops. For example, as illustrated in FIG. 11C, when the number of operation pulses of the motor 31 required to move the stage 21 to the undocking position is 10000 pulses, an operation of stopping the rotating shaft of the motor 31 for the moment each time the stage 21 is retreated by rotating the rotating shaft of the motor 31 forward by 2000 pulses, and rotating the rotating shaft of the motor 31 forward by 2000 pulses again is repeatedly performed until a time T3 that the stage 21 finishes moving to the undocking position. By performing this operation, the lip portion 50b separates from the second flat surface 58 at an earlier time than the time that the stage 21 moves to the undocking position. Accordingly, the FOUP body 1 is not floated up. Incidentally, as illustrated in FIGS. 11B and 11C, in order to suppress the reduction in the throughput of the entire opening operation, the stage 21 may be retreated to the undocking position at a second operation speed, and the following operation may be performed to move the stage 21 at a first operation speed that is a high operation speed.

In addition, the load port 8 of the present embodiment can also perform opening operations other than the above opening operations. In another embodiment of the second operation procedure, the mode may be such that when the stage 21 is retreated from the docking position to the undocking position, the stage 21 is moved to the undocking position while repeating an operation of retreating the stage 21 to a predetermined position, then advancing the stage 21 for the moment, and thereafter, retreating the stage 21 again. This operation is performed by sequentially switching the rotational direction and the rotational angle of the rotating shaft of the motor 31 of the stage drive unit 23 provided in the load port 8.

Figure 12A:
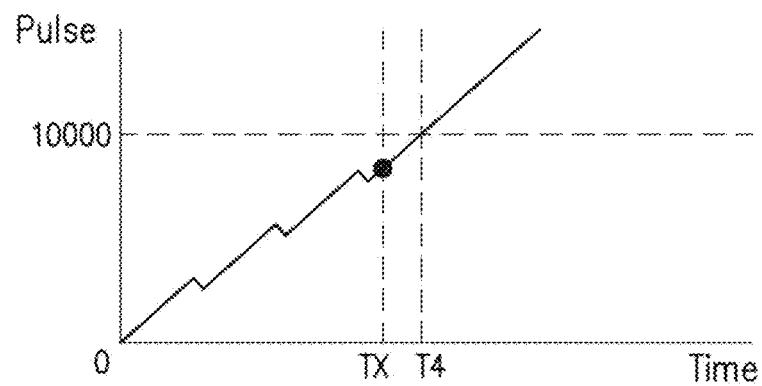
FIG. 12A, FIG. 12B and FIG. 12C are graphs illustrating another example of the second operation procedure.

For example, as illustrated in FIG. 12A, when the number of operation pulses of the motor 31 required to move the stage 21 from the docking position to the undocking position is 10000 pulses, the stage 21 is retreated by rotating the rotating shaft of the motor 31 forward by 3000 pulses, and then the stage 21 is advanced by rotating the rotating shaft of the motor 31 reversely by 1000 pulses. Accordingly, the stage 21 is considered to have moved to a position that is 2000 pulses back from the docking position. The lid 2 and the FOUP body 1 are separated from each other by repeatedly performing this operation until a time T4 that the stage 21 moves to the undocking position.

By gradually peeling the stuck lip portion 50b off from the second flat surface 58 through the various operations described above, the lid 2 and the FOUP body 1 can be separated from each other while preventing the FOUP body 1 from being floated up. Incidentally, in order to suppress the reduction in the throughput of the entire opening operation, the operation speed at which the stage 21 retreats by 3000 pulses and the operation speed at which the stage 21 advances by 1000 pulses may be set to a higher operation speed than in the first operation procedure. In addition, speed data or instruction data and the operation program of the motor used in the opening operation are stored in the load port control unit 35 provided in the load port 8, and the load port control unit 35 executes the opening operation according to the stored operation program. Incidentally, the distance by which the lid 2 is pressed against the flange 48, the movement amount (the number of pulses) of the stage 21 in the first operation procedure or the second operation procedure, or other numerical values or amounts described above are merely for illustration purpose, and can be adjusted as appropriate depending on the type of the FOUP 30 or the configuration of the stage drive unit 23.

In addition, in another embodiment of the second operation procedure, the FOUP body 1 and the lid 2 can also be separated from each other by retreating the stage 21 while vibrating the load port door 28 in the up-down direction (vertical direction). In the load port 8 of the present embodiment, the airflow adjustment member 61 is disposed at a top and at a left and a right of the load port door 28, and a predetermined gap 64 is provided between the load port door 28 and the airflow adjustment member 61 (refer to FIGS. 2, 4A, 4B, 8A, 8B and 8C). Here, when the dimension of the gap 64 is L1, the load port door 28 is vibrated within an operation range smaller than the dimension L1 of the gap 64 above the load port door 28. Incidentally, the airflow adjustment member 61 is disposed in a direction deeper than a surface of the load port door 28 which comes into contact with the lid 2, namely, toward the internal space of the EFEM 7. For this reason, even when the stage 21 advances, and the load port door 28 and the lid 2 are integrated, the FOUP body 1 and the airflow adjustment member 61 do not come into contact with each other, and even when the load port door 28 vibrates in the up-down direction, the FOUP body 1 and the airflow adjustment member 61 do not rub against each other, and dust is not generated.

Figure 12B:
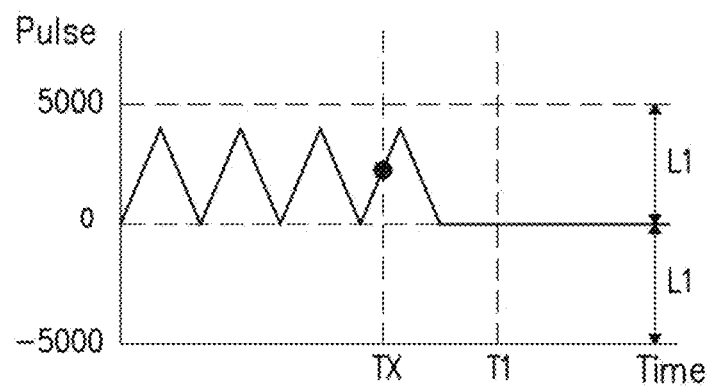

The vibration operation of the load port door 28 is executed by raising and lowering the load port door 28 through sequentially switching the rotational direction and the rotational angle of the rotating shaft of the motor 33 that is a drive source of the door lifting unit 29, until the load port door 28 and the lid 2 are integrated and then the stage 21 moves to the undocking position. FIG. 12B is a graph illustrating a raising and lowering operation of the load port door 28 during the movement of the stage 21 from the docking position to the undocking position. The horizontal axis of the graph represents elapsed time, the vertical axis represents the number of operation pulses of the motor 33 of the door lifting unit 29, which indicates the movement distance of the load port door 28, and the number of pulses when the load port door 28 is at the docking position where the load port door 28 is integrated with the lid 2 is 0. A vertical dashed line T1 on the graph indicates the time that the stage 21 has finished moving to the undocking position, and a point on the graph indicates a time TX that the lip portion 50b has separated from the second flat surface 58.

In the load port 8 of the present embodiment, when the load port door 28 is moved upward by 5000 pulses, there is a risk that the load port door 28 comes into contact with the airflow adjustment member 61, so that the upper limit of the operation range of the load port door 28 is set to approximately 4000 pulses. When the load port door 28 is vibrated, the load port door 28 is moved upward by rotating the rotating shaft of the motor 33 forward by 4000 pulses, and then the load port door 28 is returned to the original docking position (the number of pulses is 0) by moving the load port door 28 downward through rotating the rotating shaft of the motor 33 reversely by 4000 pulses. By raising and lowering the load port door 28, the lid 2 integrated with the load port door 28 is also repeatedly raised and lowered with respect to the FOUP body 1, and the stuck lip portion 50b is peeled off from the second flat surface 58, so that the FOUP body 1 and the lid 2 are separated from each other. Incidentally, it is desirable that the raising and lowering of the load port door 28 continues until the stage 21 moves to the undocking position. In addition, by retreating the stage 21 to the undocking position according to the second operation procedure, and thereafter, by moving the stage 21 according to the first operation procedure in which the operation speed is high, the reduction in the throughput of the entire opening operation can be suppressed.

Incidentally, the number of operation pulses or the number of the raising and lowering operation is merely for illustration purpose, and it is preferable that the number of operation pulses or the number of the raising and lowering operations is adjusted as appropriate depending on the type of the FOUP 30 or the configuration of the load port 8. In addition, in the embodiment, the setting is such that the raising and lowering operation of the load port door 28 is performed during the movement of the stage 21 from the docking position to the undocking position; however, the invention is not limited thereto, and the raising and lowering operation of the load port door 28 may be performed before the stage 21 starts moving to the undocking position after the load port door 28 and the lid 2 are integrated and the lid 2 is unlocked, or the stage 21 may start moving to the undocking position after the raising and lowering operation of the load port door 28 has been finished. Incidentally, since the load port door 28 and the lid 2 are vibrated, dust may be generated from around the latch keys 15 that integrate the load port door 28 and the lid 2; however, since the load port door 28 and the lid 2 are in close contact with each other, the generated dust does not scatter to the outside from a joint portion. In addition, even if the dust has scattered to the outside from a gap between the load port door 28 and the lid 2, the dust is discharged to the outside of the EFEM 7 by a downflow from the FFU 10, so that the dust does not adhere to the surfaces of the wafers W accommodated in the FOUP body 1.

Figure 12C:
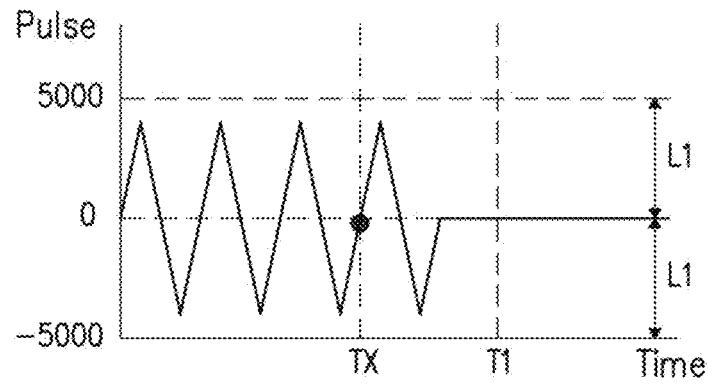

Further, as another embodiment of the raising and lowering operation performed by the load port 8, the raising and lowering operation range of the load port door 28 can also be extended downward from the docking position (0 pulses) where the load port door 28 is integrated with the lid 2. FIG. 12C is a graph illustrating the extended raising and lowering operation of the load port door 28. Similarly to FIG. 12B, the horizontal axis of the graph represents time, and the vertical axis indicates the number of operation pulses of the motor 33 of the door lifting unit 29, which indicates the movement distance of the load port door 28. In the present embodiment, in addition to an operation of moving the load port door 28 upward (positive direction) from the position where the load port door 28 is integrated with the lid 2, an operation of moving the load port door 28 downward (negative direction) from the position where the load port door 28 is integrated with the lid 2 is performed.

After the load port door 28 and the lid 2 are integrated, first, the load port door 28 is moved upward by 4000 pulses by rotating the rotating shaft of the motor 33 forward by 4000 pulses, and thereafter, the load port door 28 is moved to a position that is 4000 pulses down from the docking position (the number of pulses is 0), by moving the load port door 28 downward by 8000 pulses through rotating the rotating shaft of the motor 33 reversely by 8000 pulses. Next, the load port door 28 is moved to a position that is 4000 pulses up from the docking position, by rotating the rotating shaft of the motor 33 forward by 8000 pulses. By raising and lowering the load port door 28, the lid 2 is also repeatedly raised and lowered with respect to the FOUP body 1, and the stuck lip portion 50b is peeled off from the second flat surface 58, so that the FOUP body 1 and the lid 2 are easily separated from each other. Incidentally, it is desirable that the raising and lowering of the load port door 28 continues until the stage 21 moves to the undocking position. In addition, by retreating the stage 21 to the undocking position according to the second operation procedure, and thereafter, by moving the stage 21 according to the first operation procedure in which the operation speed is high, the reduction in the throughput of the entire opening operation can be suppressed.

As described above, in the present embodiment, since the vibration range of the load port door 28 is increased, the stuck lip portion 50b can be quickly separated from the second flat surface 58. Incidentally, it is desirable that the lowering operation of the load port door 28 during vibration is suppressed to the extent that a rear end of the FOUP 30 is not floated up. In addition, in the two embodiments in which the load port door 28 is vibrated, the configuration in which the operation range of the load port door 28 when raised and lowered is based on the dimension L1 of the gap 63 between the load port door 28 and the airflow adjustment member 61 has been described; however, when the dimension L2 of the gap 62 between the FOUP body 1 and the lid 2 is smaller than the dimension L1, it is desirable that the raising and lowering range of the load port door 28 is based on the dimension L2. By performing the raising and lowering operation of the load port door 28 within an operation range smaller than the dimension L1, it can be prevented that the FOUP body 1 and the lid 2 collide with each other or the rear portion of the FOUP body 1 is floated up.

Incidentally, the number of operation pulses or the number of the raising and lowering operation is merely for illustration purpose, and it is preferable that the number of operation pulses or the number of the raising and lowering operations is adjusted as appropriate depending on the type of the FOUP 30 or the configuration of the load port 8. In addition, the raising and lowering operation of the load port door 28 may be performed in combination with an operation of moving the stage 21 from the docking position to the undocking position, the raising and lowering operation of the load port door 28 may be performed before the stage 21 starts moving to the undocking position, or the stage 21 may start moving to the undocking position after the raising and lowering operation of the load port door 28 has been finished.

In addition, various second operation procedures other than those illustrated above can be used in combination as appropriate. Further, when the lid cannot be separated even in the second operation procedure, the configuration can also be such that the various second operation procedures are executed a predetermined number of times. In addition, the configuration can also be such that the second operation procedures are prioritized as appropriate and the above-described various different second operation procedures are sequentially executed in priority order. For example, as the second operation procedure, even if the stage is moved at a slower speed than the movement speed of the first operation procedure, when the lid cannot be separated from the container body, an operation of dividing the movement of the stage and intermittently repeating movements and stops can be performed as a third operation procedure. In addition, the configuration may be such that the operation procedures described above as the second operation procedures are prioritized and executed in combination as third and fourth operation procedures.

The embodiment of the invention has been described above in detail with reference to the drawings; however, the invention is not limited to the embodiment, and can be variously changed without departing the concept of the invention.

What is claimed is:

1. A load port comprising:
a stage to place a sealable container at a predetermined position, the sealable container including a container body to accommodate a wafer and a lid to airtightly close the container body;
a sensor to detect a placement state of the sealable container on the stage;
a stage drive mechanism to advance and retreat the stage at least between a docking position and an undocking position;
a load port door to open the sealable container by being joined and integrated with the lid and then separating the lid from the container body;
a door lifting mechanism to raise and lower the load port door; and
a load port control unit to store a plurality of operation procedures for operating the stage drive mechanism, the load port door, and the door lifting mechanism, and to control an operation of the stage drive mechanism, the load port door, and the door lifting mechanism based on the operation procedures,
wherein the load port control unit controls the stage drive mechanism and the door lifting mechanism to retreat the stage to the undocking position at a first speed from a state where the load port door and the lid are joined and integrated at the docking position, based on a first operation procedure, such that the lid is separated from the container body to open the sealable container, and performs control to return the sealable container to the docking position and then to re-execute an opening operation based on a second operation procedure different from the first operation procedure, in a case where the sensor has detected a placement abnormality of the sealable container when the opening operation is performed according to the first operation procedure.

2. The load port according to claim 1,
wherein the load port control unit performs control to repeatedly execute the second operation procedure a predetermined number of times in a case where the sensor has detected a placement abnormality of the sealable container again when the second operation procedure is executed.

3. The load port according to claim 1,
wherein an airflow adjustment member is disposed at a peripheral edge at a top and at a left and right of the load port door with a predetermined gap interposed between the airflow adjustment member and the load port door, and
the second operation procedure is to cause the stage drive mechanism to move the stage from the docking position to the undocking position while causing the door lifting mechanism to perform a raising and lowering operation of the load port door integrated with the lid within a range smaller than the predetermined gap in an up-down direction.

4. The load port according to claim 3,
wherein the load port control unit performs control to repeatedly execute the second operation procedure a predetermined number of times in a case where the sensor has detected a placement abnormality of the sealable container again when the second operation procedure is executed.

5. The load port according to claim 1,
wherein the second operation procedure is to control the stage drive mechanism to retreat from the docking position at a slower speed than the first speed.

6. The load port according to claim 5,
wherein the load port control unit performs control to repeatedly execute the second operation procedure a predetermined number of times in a case where the sensor has detected a placement abnormality of the sealable container again when the second operation procedure is executed.

7. The load port according to claim 5,
wherein the load port control unit performs control to return the sealable container to the docking position again and then to re-execute the opening operation based on a third operation procedure different from the first and second operation procedures, in a case where the sensor has detected a placement abnormality of the sealable container again when the opening operation is executed according to the second operation procedure of controlling the stage drive mechanism to retreat from the docking position at a slower speed than the first speed.

8. The load port according to claim 5,
wherein an airflow adjustment member is disposed at a peripheral edge at a top and at a left and right of the load port door with a predetermined gap interposed between the airflow adjustment member and the load port door, and
the second operation procedure is to cause the stage drive mechanism to move the stage from the docking position to the undocking position while causing the door lifting mechanism to perform a raising and lowering operation of the load port door integrated with the lid within a range smaller than the predetermined gap in an up-down direction.

9. The load port according to claim 8,
wherein the load port control unit performs control to repeatedly execute the second operation procedure a predetermined number of times in a case where the sensor has detected a placement abnormality of the sealable container again when the second operation procedure is executed.

10. The load port according to claim 1,
wherein the second operation procedure is an operation procedure of dividing a distance from the docking position to the undocking position into a plurality of segments, and moving the stage from the docking position to the undocking position through repeating retreats and advances of the stage for each divided segmented distance.

11. The load port according to claim 10,
wherein the load port control unit performs control to repeatedly execute the second operation procedure a predetermined number of times in a case where the sensor has detected a placement abnormality of the sealable container again when the second operation procedure is executed.

12. The load port according to claim 10,
wherein the load port control unit performs control to return the sealable container to the docking position again and then to re-execute the opening operation based on a third operation procedure different from the first and second operation procedures, in a case where the sensor has detected a placement abnormality of the sealable container again when the opening operation is executed according to the second operation procedure of dividing the distance from the docking position to the undocking position into a plurality of segments, and moving the stage from the docking position to the undocking position through repeating retreats and advances of the stage for each divided segmented distance.

13. The load port according to claim 10,
wherein an airflow adjustment member is disposed at a peripheral edge at a top and at a left and right of the load port door with a predetermined gap of interposed between the airflow adjustment member and the load port door, and
the load port control unit performs control to return the sealable container to the docking position again and then to re-execute the opening operation based on a third operation procedure different from the first and second operation procedures, in a case where the sensor has detected a placement abnormality of the sealable container again when the opening operation is executed according to the second operation procedure of causing the stage drive mechanism to move the stage from the docking position to the undocking position while causing the door lifting mechanism to perform a raising and lowering operation of the load port door integrated with the lid within a range smaller than the predetermined gap in an up-down direction.

14. The load port according to claim 10,
wherein an airflow adjustment member is disposed at a peripheral edge at a top and at a left and right of the load port door with a predetermined gap interposed between the airflow adjustment member and the load port door, and
the second operation procedure is to cause the stage drive mechanism to move the stage from the docking position to the undocking position while causing the door lifting mechanism to perform a raising and lowering operation of the load port door integrated with the lid within a range smaller than the predetermined gap in an up-down direction.

15. The load port according to claim 14,
wherein the load port control unit performs control to repeatedly execute the second operation procedure a predetermined number of times in a case where the sensor has detected a placement abnormality of the sealable container again when the second operation procedure is executed.

16. The load port according to claim 1,
wherein the second operation procedure is an operation procedure of dividing a distance from the docking position to the undocking position into a plurality of segments, and retreating the stage from the docking position to the undocking position while temporarily stopping the stage for each divided segmented distance.

17. The load port according to claim 16,
wherein the load port control unit performs control to repeatedly execute the second operation procedure a predetermined number of times in a case where the sensor has detected a placement abnormality of the sealable container again when the second operation procedure is executed.

18. The load port according to claim 16,
wherein the load port control unit performs control to return the sealable container to the docking position again and then to re-execute the opening operation based on a third operation procedure different from the first and second operation procedures, in a case where the sensor has detected a placement abnormality of the sealable container again when the opening operation is executed according to the second operation procedure of dividing the distance from the docking position to the undocking position into a plurality of segments, and retreating the stage from the docking position to the undocking position while temporarily stopping the stage for each divided segmented distance.

19. The load port according to claim 16,
wherein an airflow adjustment member is disposed at a peripheral edge at a top and at a left and right of the load port door with a predetermined gap interposed between the airflow adjustment member and the load port door, and
the second operation procedure is to cause the stage drive mechanism to move the stage from the docking position to the undocking position while causing the door lifting mechanism to perform a raising and lowering operation of the load port door integrated with the lid within a range smaller than the predetermined gap in an up-down direction.

20. The load port according to claim 19,
wherein the load port control unit performs control to repeatedly execute the second operation procedure a predetermined number of times in a case where the sensor has detected a placement abnormality of the sealable container again when the second operation procedure is executed.

* * * * *